(12) United States Patent
Haas et al.

(10) Patent No.: US 12,408,509 B2
(45) Date of Patent: Sep. 2, 2025

(54) OPTOELECTRONIC DEVICE AND MANUFACTURING METHOD FOR AN OPTOELECTRONIC DEVICE

(71) Applicants: MICROOLED, Grenoble (FR); COMMISSARIAT A L'ENERGIE ATOMIQUE ET AUX ENERGIES ALTERNATIVES, Paris (FR)

(72) Inventors: Gunther Haas, St Egreve (FR); Benoit Dugrenil, Grenoble (FR); Sébastien Guillamet, Lyons (FR); Myriam Tournaire, Grenoble (FR); Tony Maindron, Grenoble (FR)

(73) Assignees: MICROOLED, Grenoble (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 337 days.

(21) Appl. No.: 18/004,068

(22) PCT Filed: Jul. 2, 2021

(86) PCT No.: PCT/IB2021/055950
§ 371 (c)(1),
(2) Date: Jan. 2, 2023

(87) PCT Pub. No.: WO2022/003640
PCT Pub. Date: Jan. 6, 2022

(65) Prior Publication Data
US 2023/0337454 A1    Oct. 19, 2023

(30) Foreign Application Priority Data
Jul. 2, 2020    (FR) ........................ 2006988

(51) Int. Cl.
*H10K 50/852*    (2023.01)
*H10K 39/30*    (2023.01)
(Continued)

(52) U.S. Cl.
CPC ........... *H10K 50/852* (2023.02); *H10K 39/30* (2023.02); *H10K 50/12* (2023.02); *H10K 50/131* (2023.02);
(Continued)

(58) Field of Classification Search
None
See application file for complete search history.

(56) References Cited

U.S. PATENT DOCUMENTS

2011/0229994 A1    9/2011   Jung
2017/0187001 A1    6/2017   Fang et al.

FOREIGN PATENT DOCUMENTS

EP    3671849 A1    6/2020

OTHER PUBLICATIONS

International Search Report for PCT/IB2021/055950, mailed Oct. 1, 2021.

*Primary Examiner* — Anthony Ho
(74) *Attorney, Agent, or Firm* — Jordan IP Law, LLC; Todd A. Vaughn

(57) ABSTRACT

An optoelectronic device that includes a substrate and a stack of organic layers that has at least one active layer arranged between a reflective surface and a semi-reflective surface arranged facing one another at a given distance and forming an optical cavity. The device includes at least three groups of pixels, each group of which is characterized by a cavity of a different optical length, the cavity having a number of bilayers arranged between the substrate and said stack of organic layers, each bilayer being formed of a first transparent and conductive layer of a first transparent and
(Continued)

conductive material, and of a second transparent and conductive layer of a second transparent and conductive material, in direct contact with the first transparent and conductive layer.

18 Claims, 13 Drawing Sheets

(51) Int. Cl.
  *H10K 50/12*   (2023.01)
  *H10K 50/13*   (2023.01)
  *H10K 71/20*   (2023.01)
  *H10K 71/30*   (2023.01)
  *H10K 50/816*   (2023.01)
  *H10K 50/818*   (2023.01)

(52) U.S. Cl.
  CPC ........... *H10K 71/233* (2023.02); *H10K 71/30* (2023.02); *H10K 50/816* (2023.02); *H10K 50/818* (2023.02)

[Fig. 1]
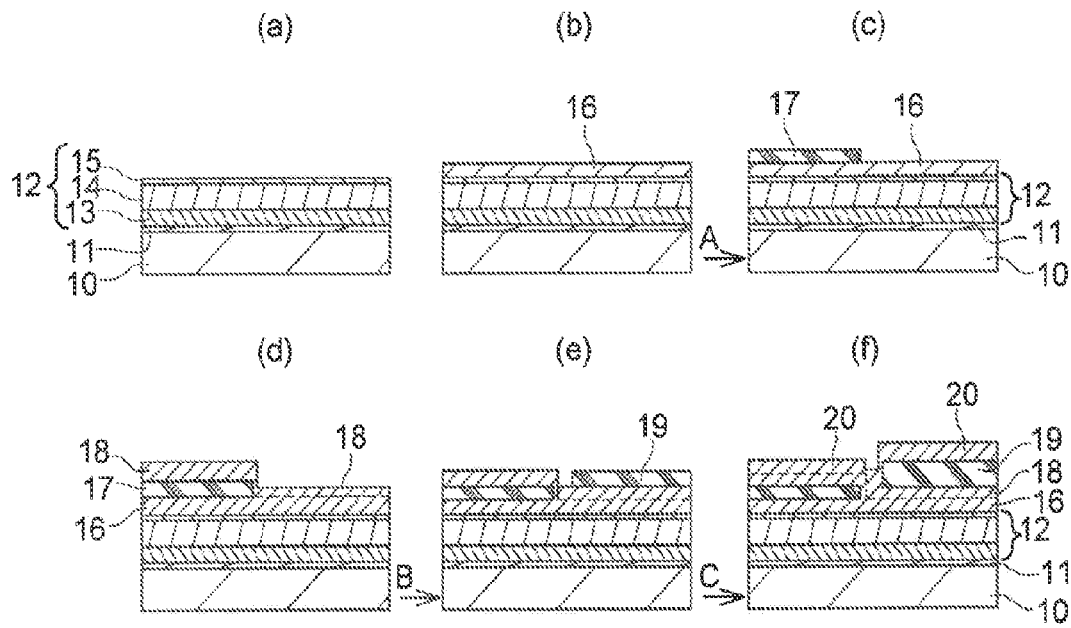
[Fig. 2]
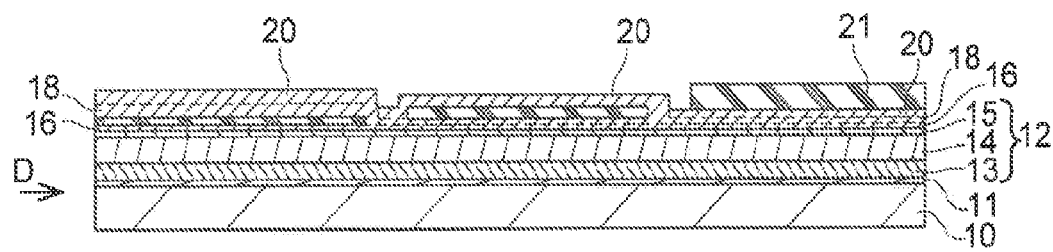
[Fig. 3]
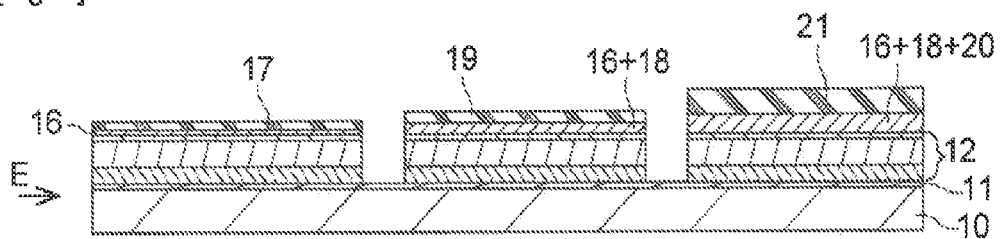
[Fig. 4]
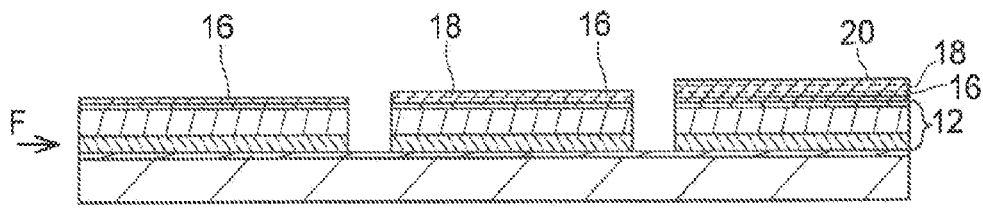

[Fig. 5]
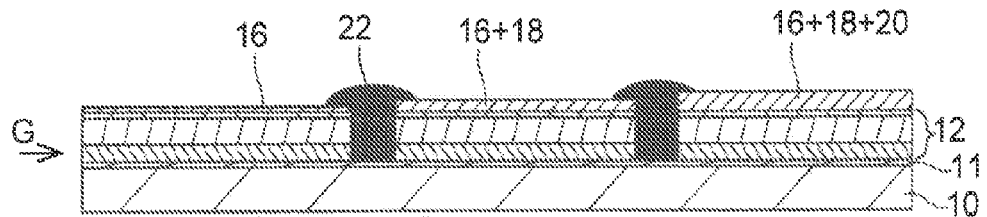
[Fig. 6]
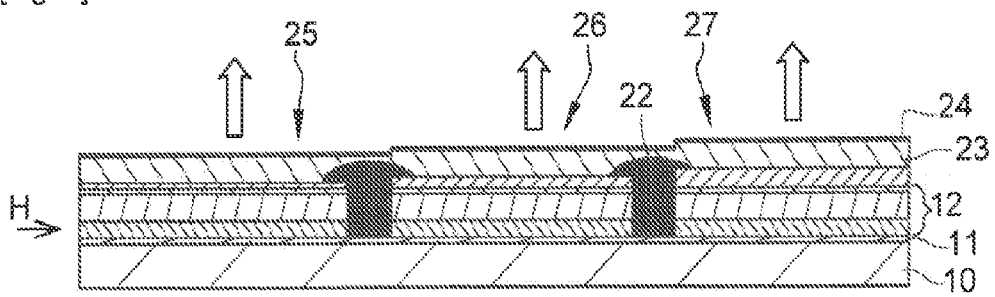
[Fig. 7]
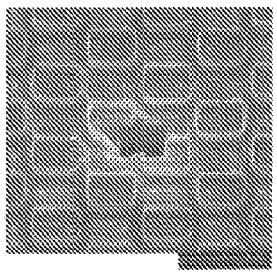
[Fig. 8]
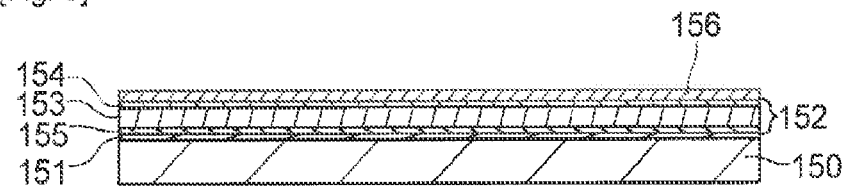
[Fig. 9]
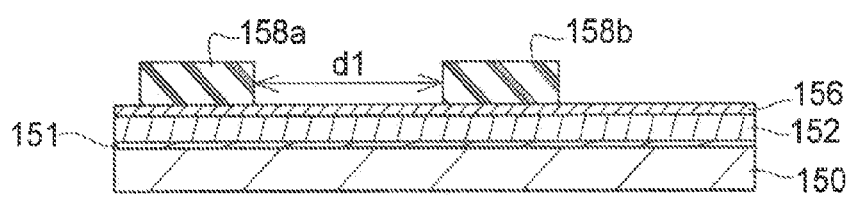

[Fig. 10]
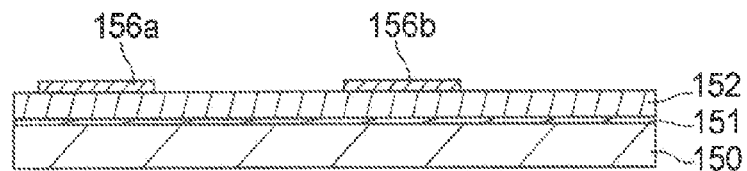
[Fig. 11]
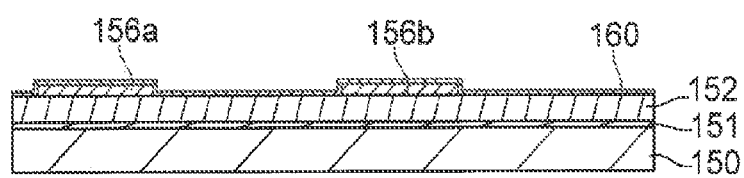
[Fig. 12]
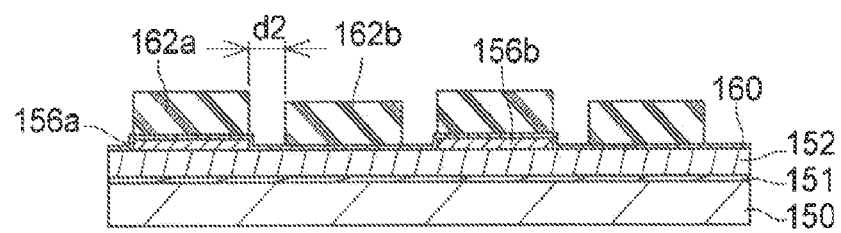
[Fig. 13]
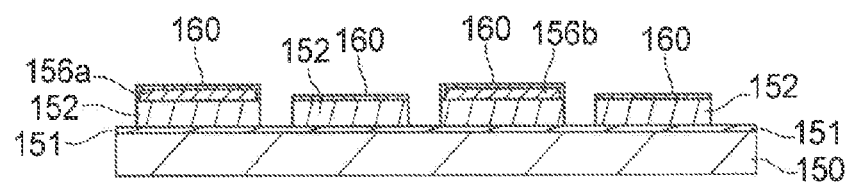
[Fig. 14]
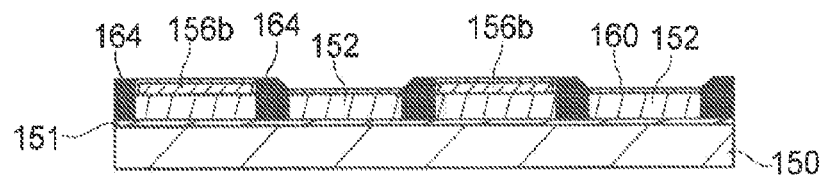

[Fig. 15]
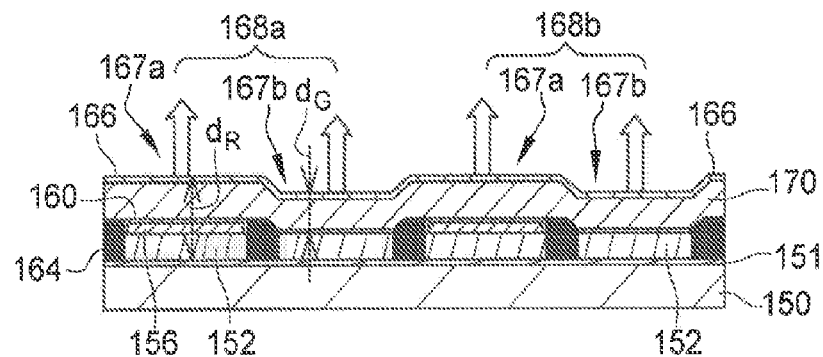
[Fig. 16]
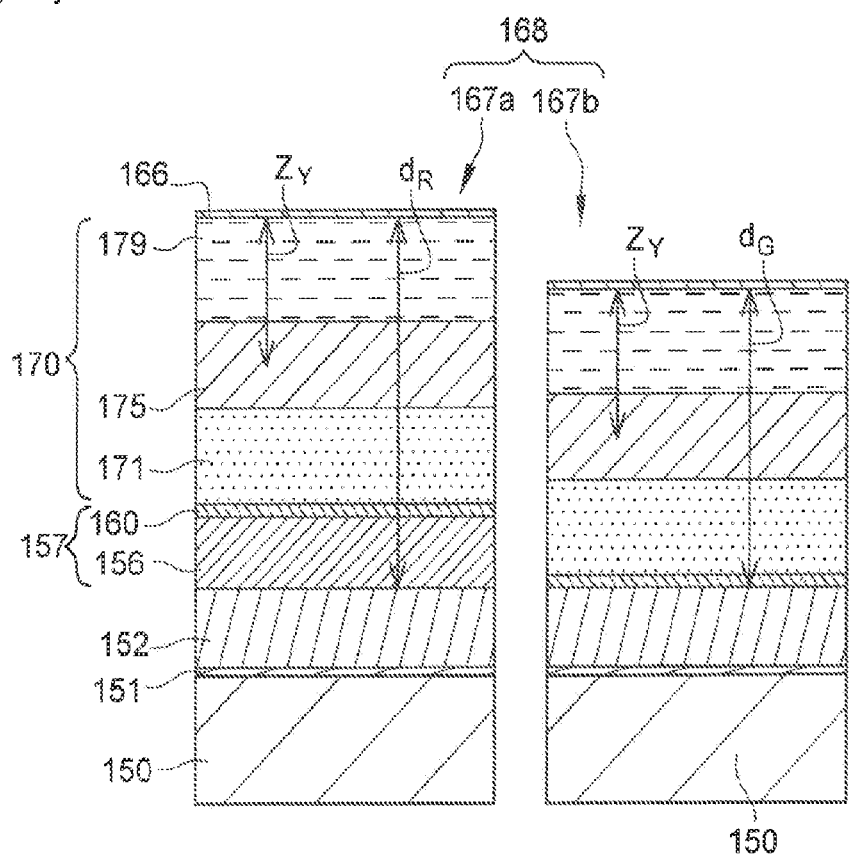

[Fig. 17]
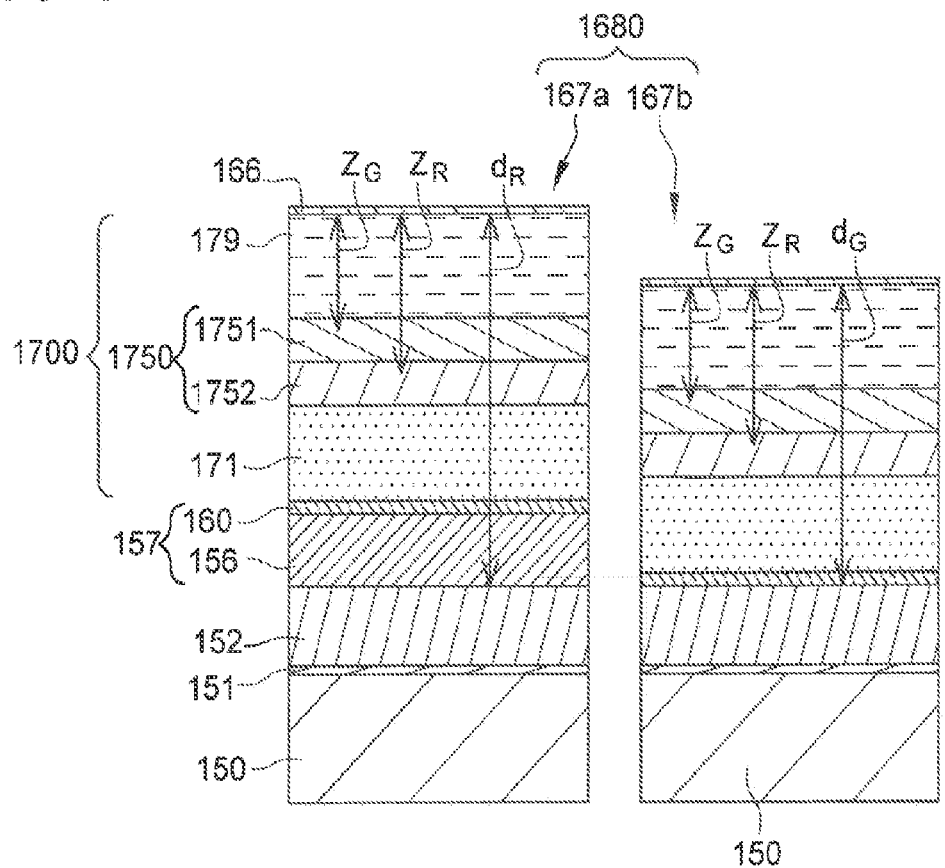
[Fig. 18]
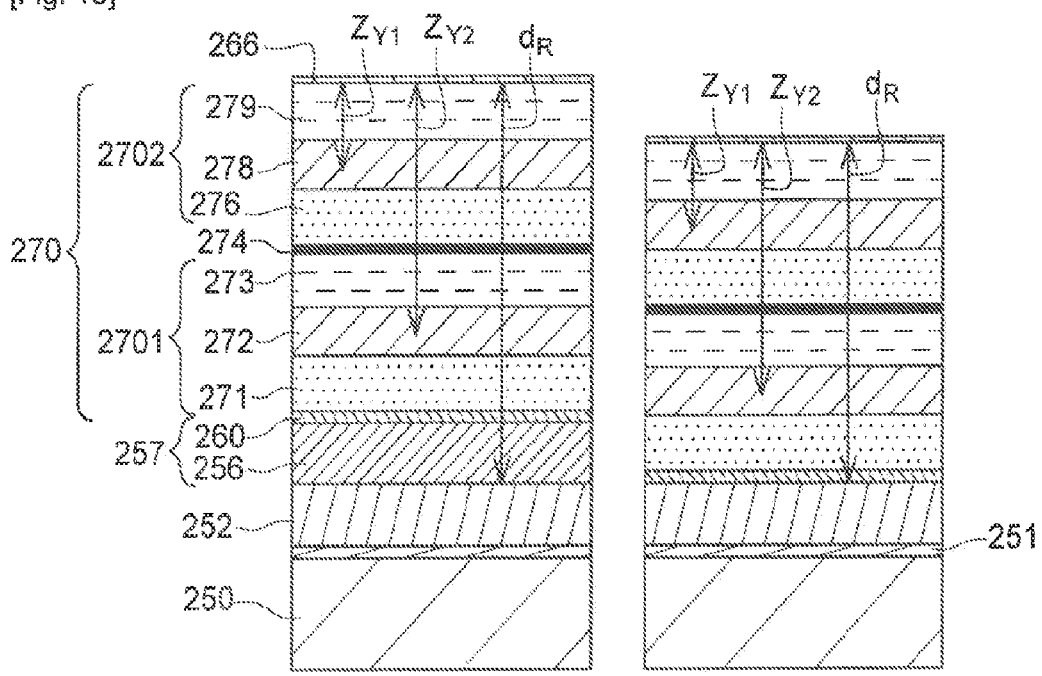

[Fig. 19]
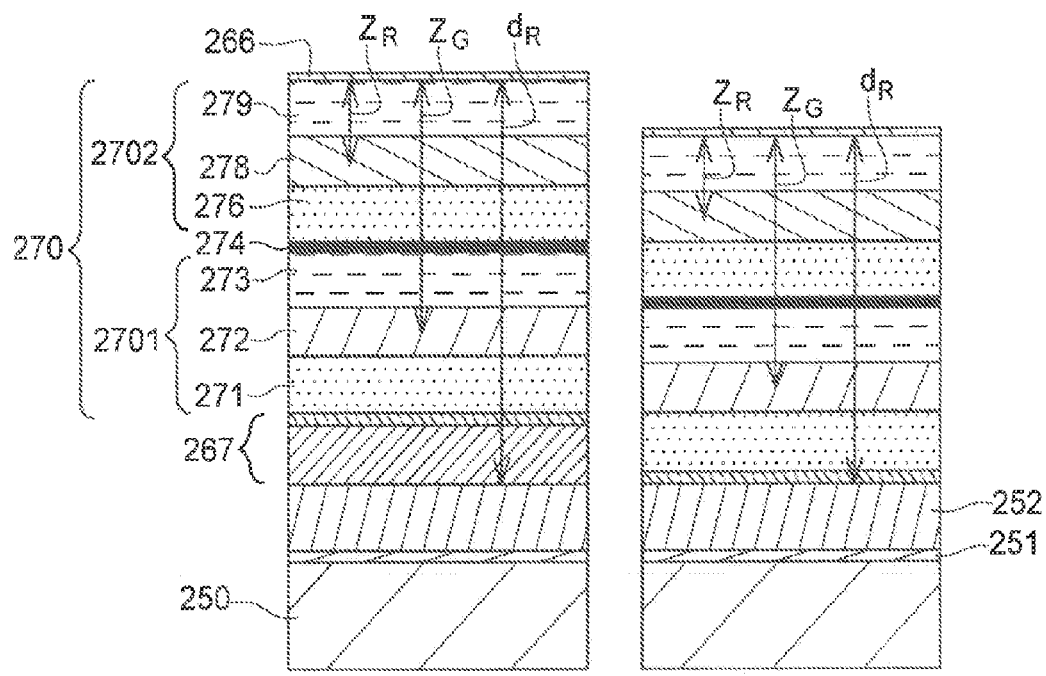
[Fig. 20]
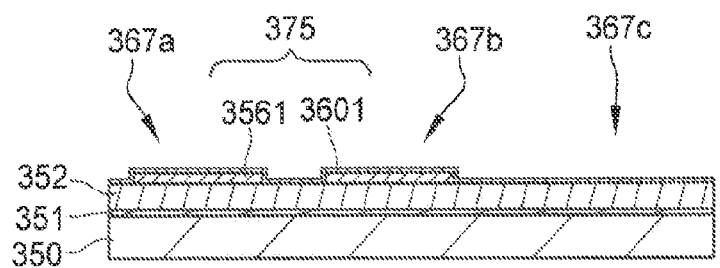
[Fig. 21]
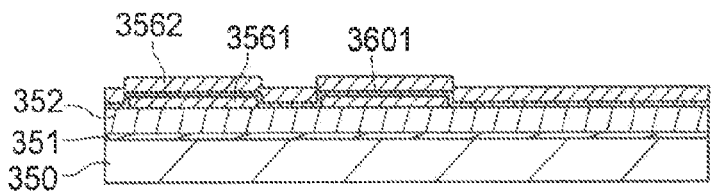

[Fig. 22]
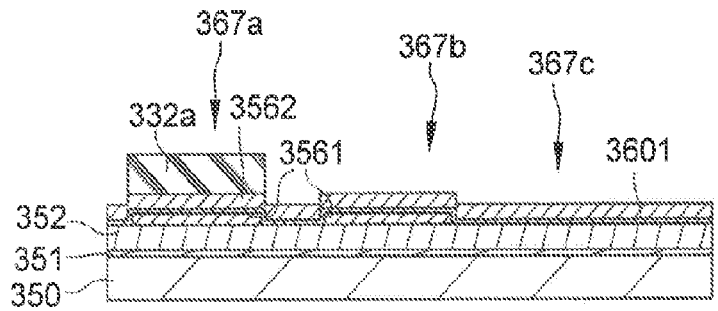
[Fig. 23]
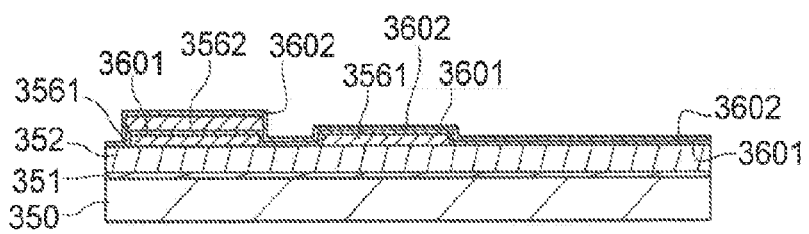
[Fig. 24]
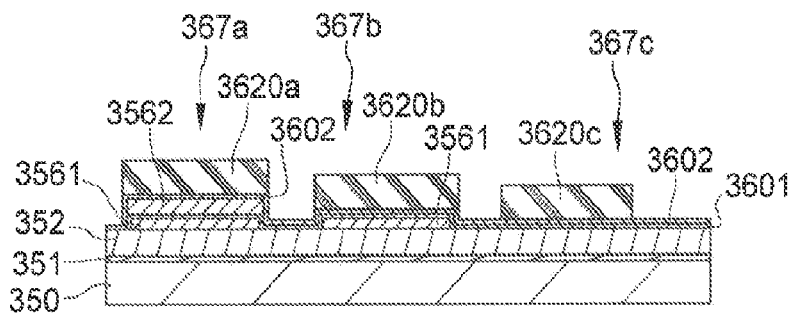
[Fig. 25]
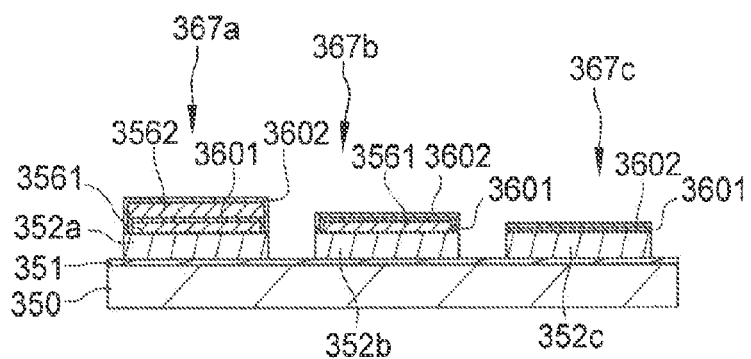

[Fig. 26]
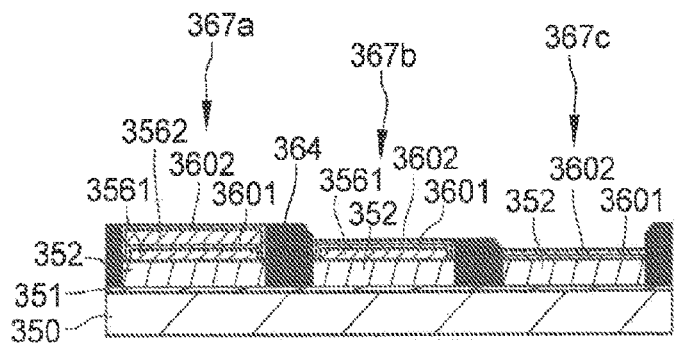
[Fig. 27]
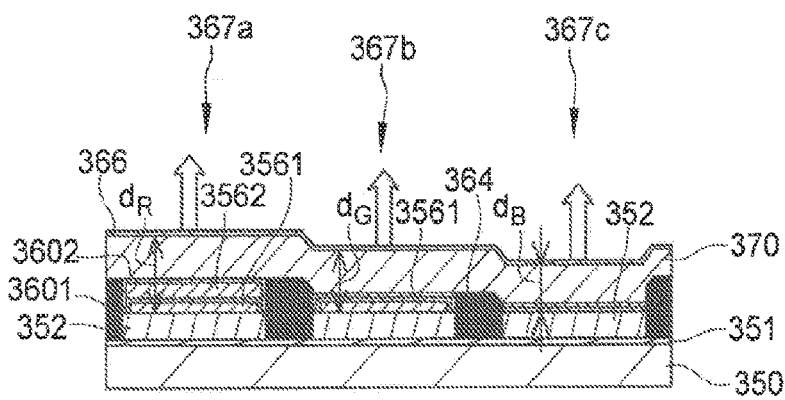
[Fig. 28]
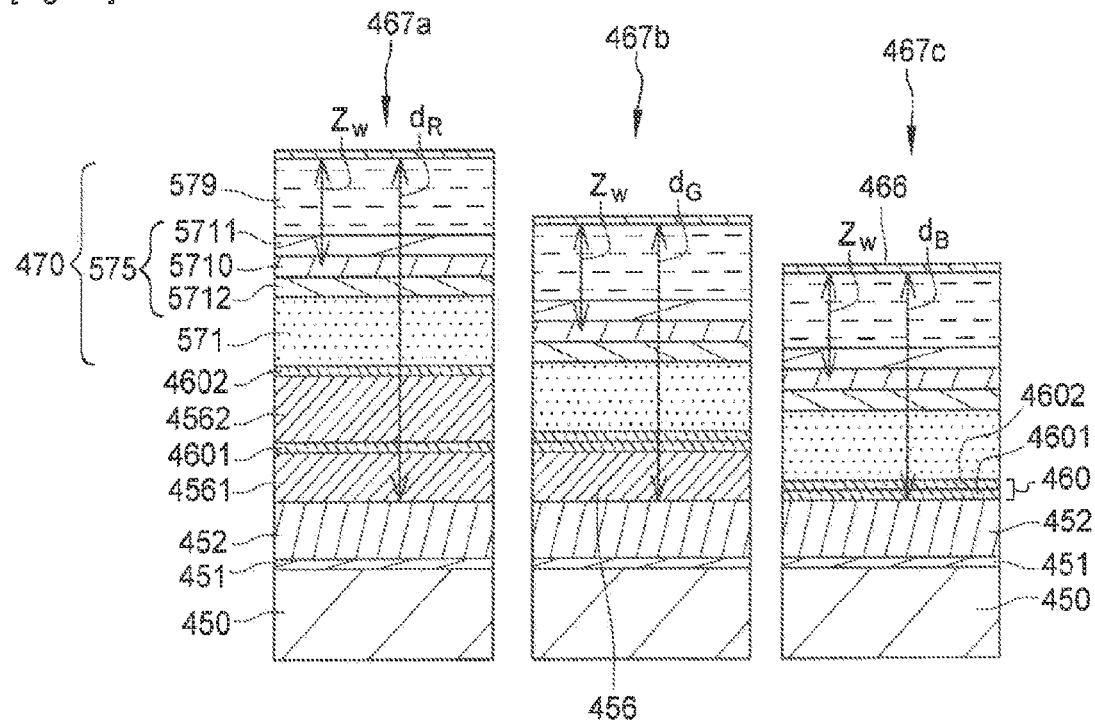

[Fig. 29]
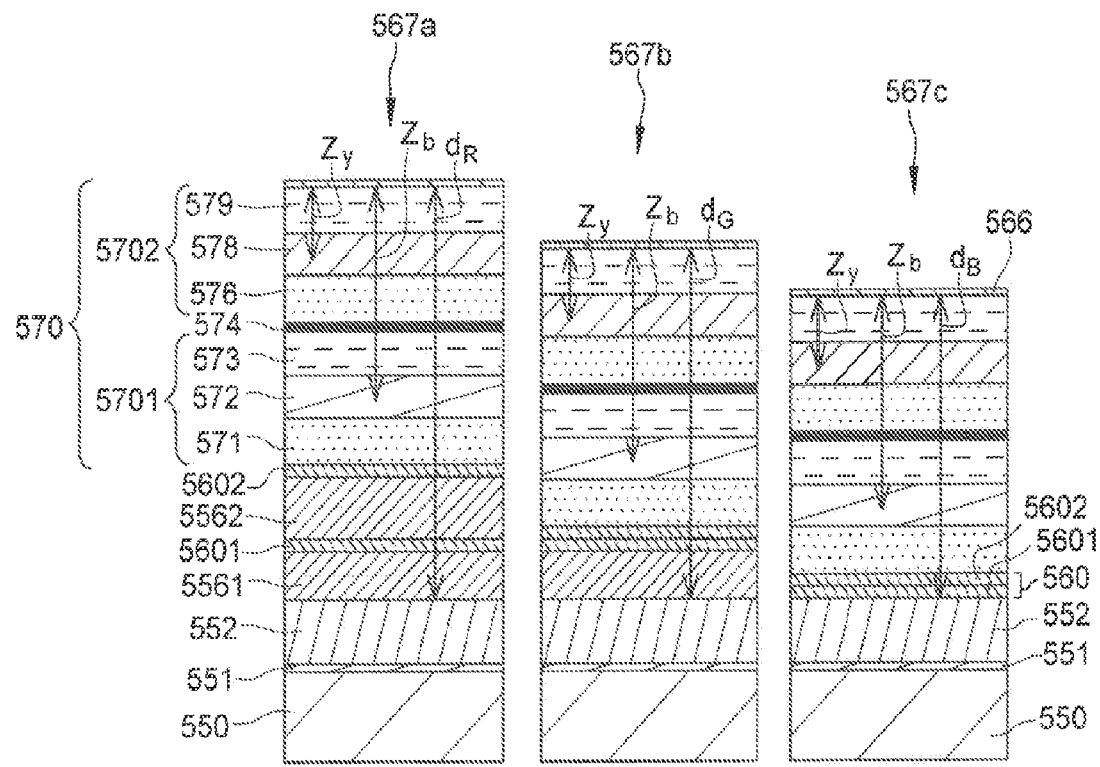
[Fig. 30]
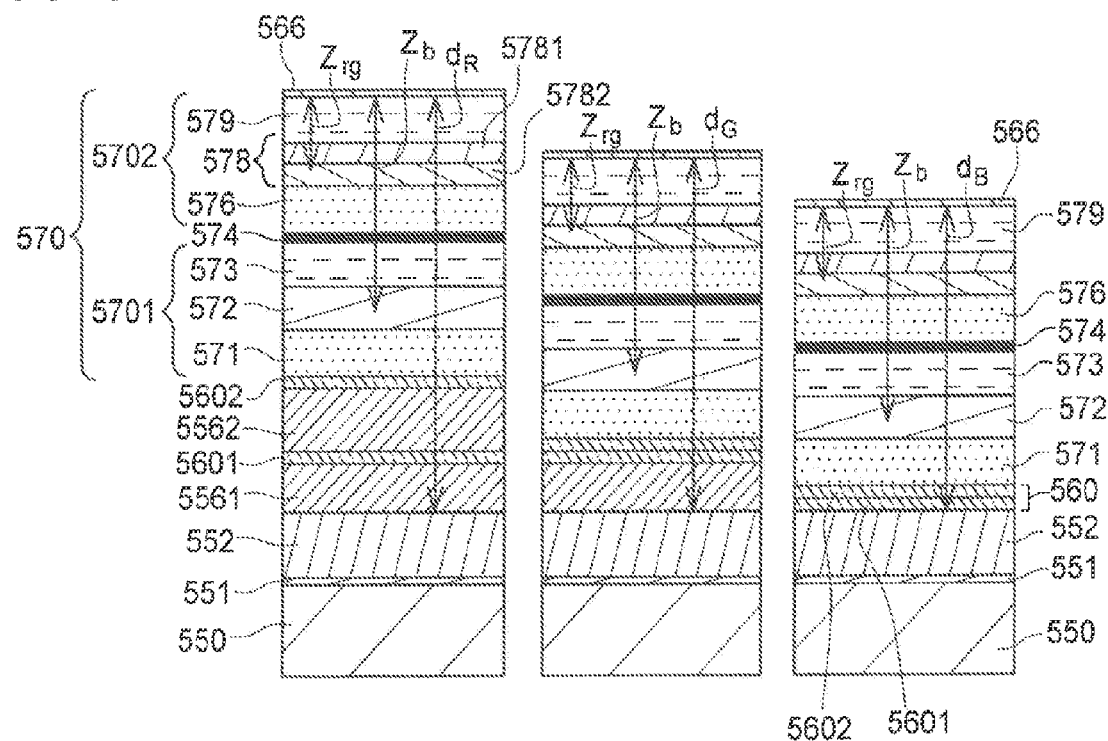

[Fig. 31]
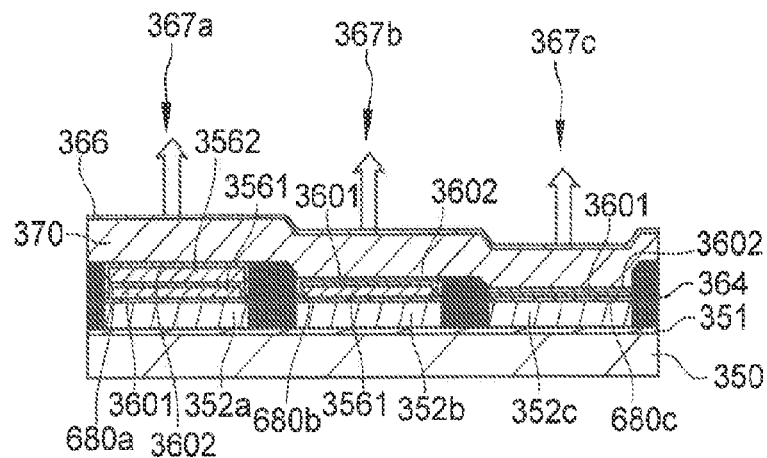
[Fig. 32]
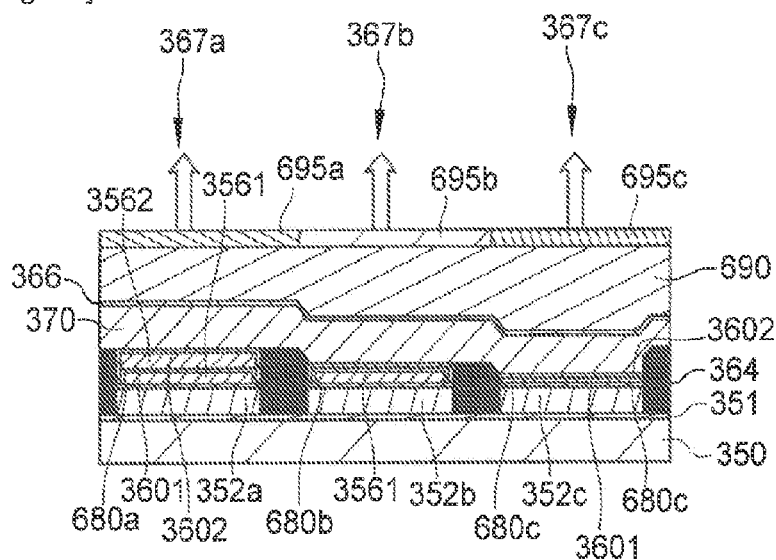
[Fig. 33]
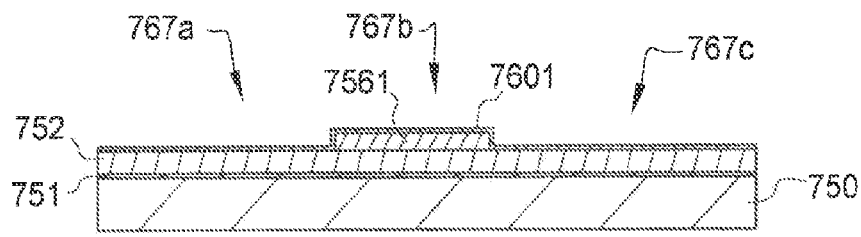

[Fig. 34]
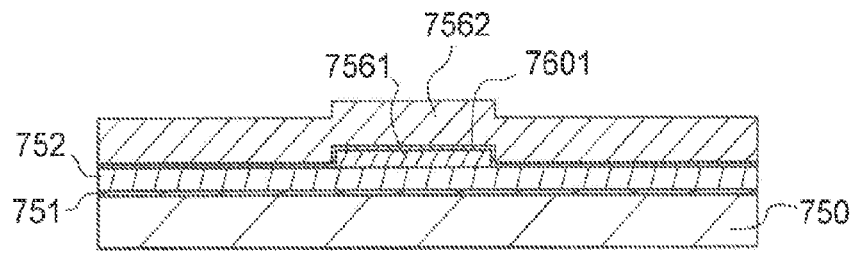
[Fig. 35]
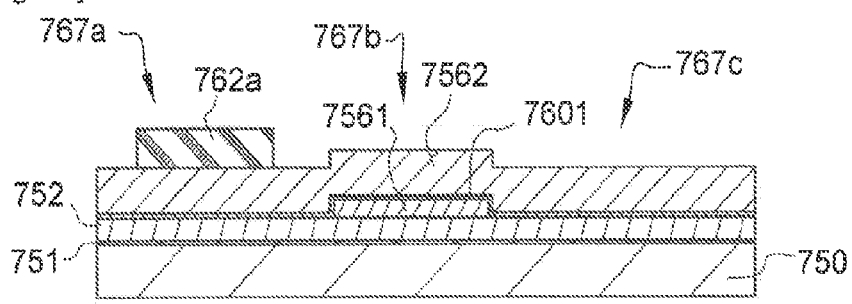
[Fig. 36]
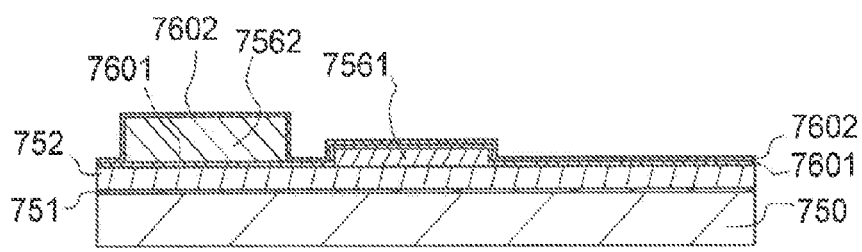
[Fig. 37]
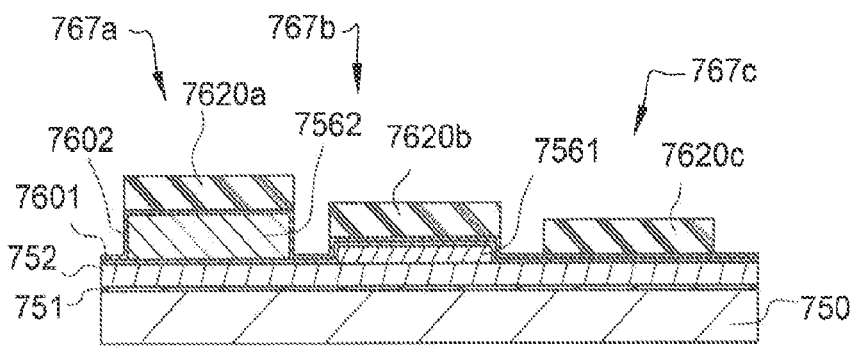

[Fig. 38]
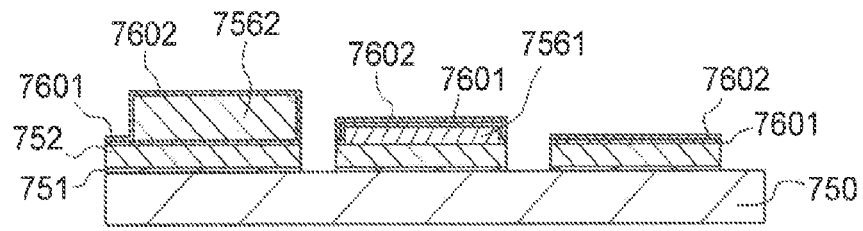
[Fig. 39]
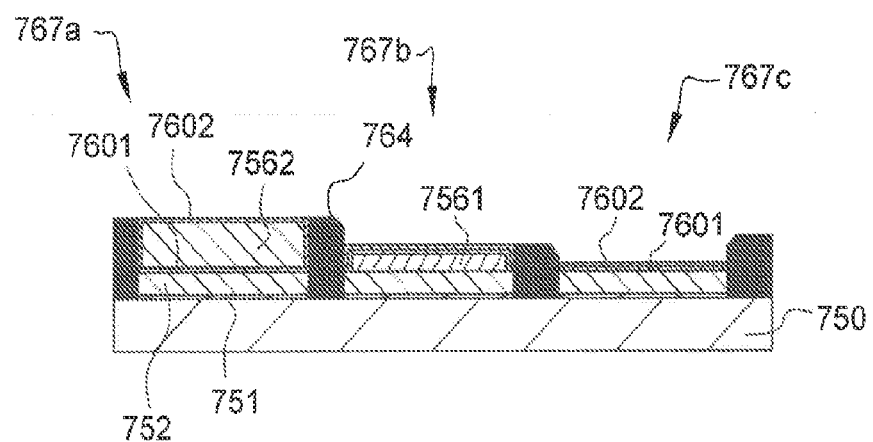
[Fig. 40]
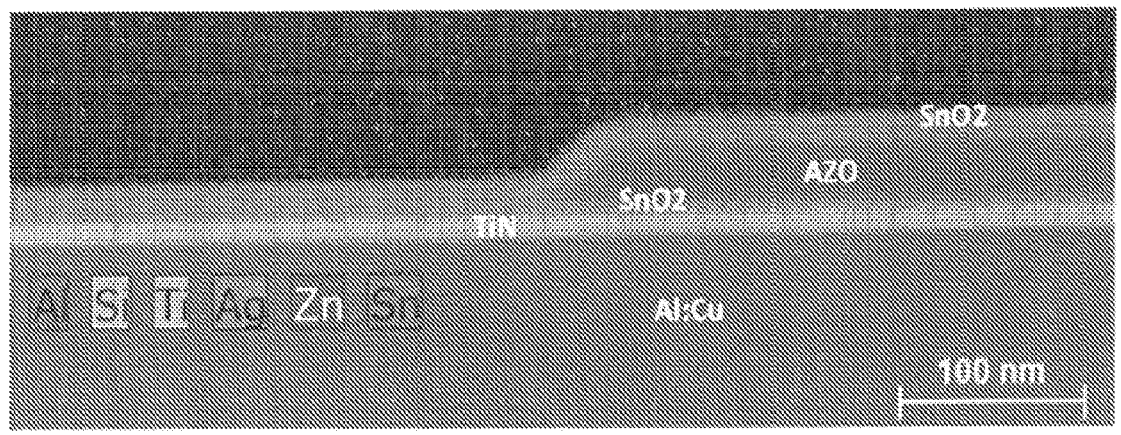

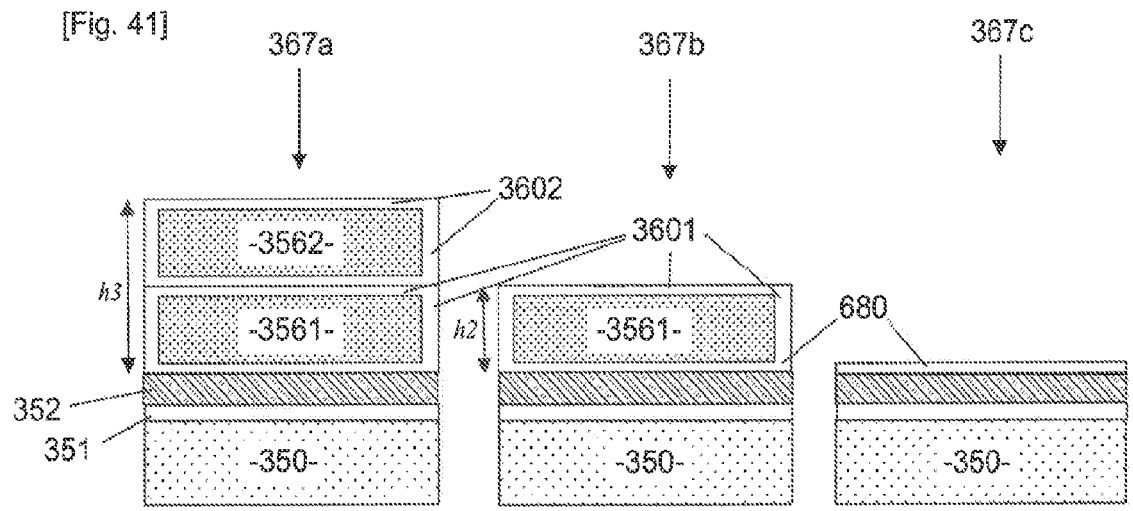
[Fig. 41]
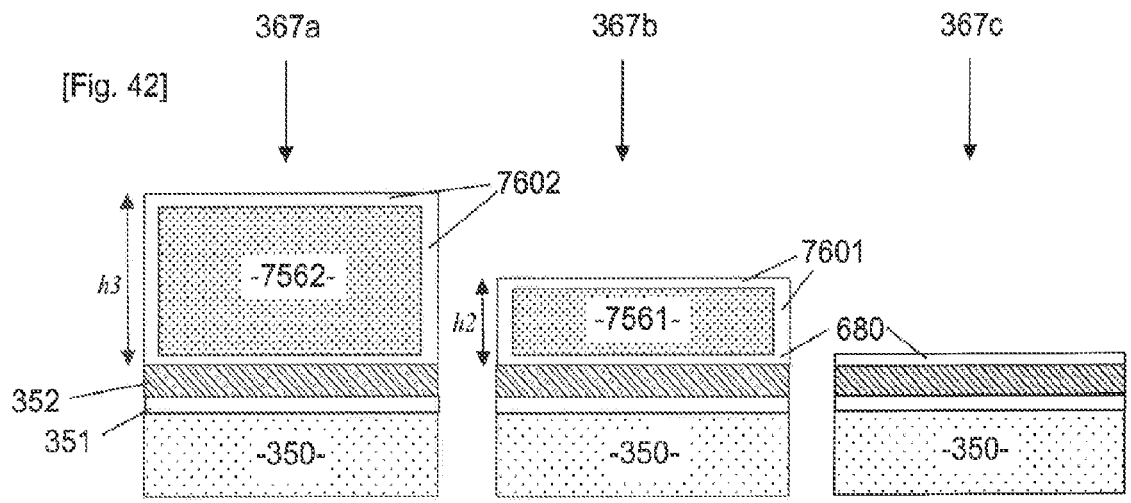
[Fig. 42]

OPTOELECTRONIC DEVICE AND MANUFACTURING METHOD FOR AN OPTOELECTRONIC DEVICE

CROSS-REFERENCE TO RELATED APPLICATION

The present application is a National Stage Application of PCT International Application No. PCT/IB2021/055950 (filed on Jul. 2, 2021), under 35 U.S.C. § 371, which claims priority to French Patent Application No. FR 2006988 (filed on Jul. 2, 2020), which are each hereby incorporated by reference in their complete respective entireties.

TECHNICAL FIELD

The invention relates to the field of microelectronics and more precisely to the field of optoelectronic devices in thin layers. More precisely, it relates to a matrix optoelectronic device in thin layers having active layers that are organic layers, in the chemical sense of the term. These optoelectronic devices can be display screens of the OLED (Organic Light Emitting Device) type or optical sensors, the active layers of which are organic layers. They have a novel structure with an optical cavity of a different optical length for each group of pixels of a different color.

The invention also relates to a novel method for manufacturing these novel products.

BACKGROUND

Matrix microdisplays of the OLED type that have a pixel size of less than approximately 20 µm, typically between 6 µm and 12 µm, are known. In a color microdisplay, each pixel is composed of several groups of pixels, the size of which is less than approximately 10 µm, and which is currently typically approximately 3 µm to 6 µm. In these microdisplays, the color of the groups of red (abbreviated R), green (abbreviated G) and blue (abbreviated B) pixels is generated by a white-emission OLED stack common to the entire matrix, each pixel being provided with its specific color filter. OLED stacks designed to directly generate red, green or blue light are certainly known. However, they cannot be used to manufacture OLED microdisplays, for several reasons.

First of all, in OLED microdisplays, the size of the RGB pixels is so small that it is not currently possible, with sufficient industrial reliability, to structure the OLED stacks at the R, G and B pixels so as to obtain pixels that directly emit light of a desired color. Indeed, the structuring of the deposits of OLED layers can be carried out via evaporation under vacuum through a mask, but only with a size greater than approximately 20 µm.

Moreover, depositing an OLED stack common to the entire matrix (i.e. on a silicon wafer including several microdisplay devices with a resolution of the size of the device which is several millimeters) allows to use a deposition method that is simple and easy to control, with good industrial performance.

Finally, the materials and methods for creating the colored filters are available, well known and industrially tested, insofar as they are already used for imagers of the CMOS (Complementary Metal-Oxide-Semiconductor) type.

The use of a common OLED stack, although currently inevitable for OLED microdisplays, has however the disadvantage of a low optical efficiency. Indeed, the optical transmission of the filters in the bandwidth is only between 50% and 70%. Moreover, for a white emitter, it is not possible to take advantage of a gain in the normal direction by the cavity effect, contrary to that which takes place for separate RGB emitters. On the contrary, a top emission configuration is typically used, i.e. with an emission in the direction opposite to the substrate. In this case the OLED device substantially consists of a reflective electrode on the bottom, the stack of the organic layers (OLED), and a semitransparent electrode on the top. This assembly forms an optical cavity, which unfortunately absorbs a part of the white spectrum emitted by the OLED stack.

There are numerous patent documents that testify to the importance and the difficulty of this problem known since the beginning of the 90 s. Many inventors have used the principle of incorporating optical cavities into an OLED structure that is white or of a given color, to extract spectral bands therefrom by interference, and to thus either generate RGB primaries by interference or improve the efficiency of the systems with a colored filter or of the systems with RGB OLEDs structured at the level of the pixel.

For example, European Patent Publication No. EP 0 616 488 A (Hitachi) from 1993 describes, for a bottom emission configuration, i.e. through the substrate, an OLED device with at least two optical cavities that define respective emission wavelengths. The OLED emitter implements a single stack that generates a spectrum sufficiently broad to cover all the various optical cavities. The optical cavity comprises a semitransparent mirror formed by a dielectric multilayer system and a reflective electrode on the part opposite to the substrate, the cathode being made of transparent conductive oxide (abbreviated TCO, which is in this case made of indium oxide doped with tin, abbreviated ITO, for Indium Tin Oxide). The optical thickness of the cavity is modulated, either by the thickness of the transparent anode, or by an optical spacer made of silica that is added between the semitransparent mirror and the cathode.

This pioneer patent gave rise to several improvements. In this respect, Japanese Patent Publication No. JP 2003 142 277 A (Pioneer) describes a similar device of the bottom emission type, with structured RGB emitters; the thickness of the anode made of ITO is different according to the color of the group of pixels, and the interference is determined by the position of the emitter with respect to the reflector.

U.S. Pat. No. 6,639,250 B1 (Seiko Epson and Cambridge Display Technology) proposes for a device of the bottom emission type a similar approach, which uses dielectric mirrors on both sides to form the optical cavity. Each group of RGB pixels has available its own microcavity using a system of semitransparent dielectric multilayers, a system of reflective multilayers, and a dielectric layer with an adjustable thickness (gap adjustment layer) located above the OLED stack. This device has a multilayer structure with a very high complexity, and it is unclear how the adjustable dielectric layer and the system of reflective multilayers can be structured (pixelized).

European Patent Publication No. EP 1 450 419 B1 (Kodak) describes devices of the top emission and bottom emission type with a structure in which the optical cavity is defined by two metal mirrors. An OLED stack with broad spectrum optical emission is placed between a semitransparent reflector and a reflective electrode, including a conductive transparent phase modulation layer (called "phase layer", made of TCO, for example ITO) which allows the modulation of the associated optical cavity. This phase modulation layer is deposited by evaporation or cathode sputtering, then structured by conventional photolithography means in order to leave on the pixels of a group of pixels an intended color. Then the method is repeated with a second layer for the pixels of a group of pixels of another intended color. Thus with two sequences of photolithography groups of R, G and B pixels can be created: the group of B pixels does not have a phase modulation layer, the group of G pixels one, and the group of R pixels two. For the devices of the bottom emission type, an absorption reduction layer is added between the substrate and the semitransparent electrode. This approach requires the etching of several layers of TCO, which is complex. Moreover, the control of the uniformity of the thickness of the TCO layers deposited by cathode sputtering or evaporation appears to be very difficult with a precision compatible with the requirements of an optical cavity.

European Patent Publication No. EP 1 672 962 B1 (Sony) describes a device of the top emission type similar to that of the previous document. The lower electrode comprises three layers of TCO: a contact layer made of ITO, a resonance layer acting as a reflector, and another layer, the thickness of which depends on the intended color. This electrode is structured (pixelized) by involving methods from microelectronics. The control of the thickness of the layers of TCO is critical; this layer can be deposited by cathode sputtering (with a control of the thickness that seems insufficient) or by ALD (Atomic Layer Deposition), a technique that allows very precise control of the thickness, but which only offers a limited choice of materials (ZnO, AZO (zinc oxide doped with aluminum) or $SnO_2$). However, the deposition of the layer of TCO by ALD has two disadvantages specific to this structure: On the one hand, given that the TCO must be deposited on a photosensitive resin, the deposition by ALD, because of its perfect conformity, is also deposited on the vertical sides of the resin, with a tendency to create vertical walls that resist the removal of the photosensitive resin (routinely called "photoresist"). On the other hand, the etching of layers deposited by ALD turns out to be highly critical: Certain types of TCO capable of being deposited by ALD such as ZnO or AZO are etched very easily, however the layers are attacked in particular during the removal (stripping) of the resin, and thus a precise control of their thickness is not possible. Other types of TCO such as $SnO_2$ form, however, very hard layers that are not attacked by the developer of the photosensitive resin, nor during the stripping, and they are very difficult to etch.

This document describes an alternative that avoids the problems related to the deposition of the TCO on photosensitive resin, by using three different materials and three different etching methods for each of the three layers of TCO, the materials being chosen so as to allow selective etching. The method is thus very complex, and the choice of materials is very limited.

U.S. Patent Publication No. 2009/0283786 (Seiko Epson) describes another approach similar to that described in European Patent Publication No. EP 1 450 419. The device describes an OLED device with an optical cavity of a different thickness for the groups of pixels R, G, B, the thickness of the cavity being modulated by the thickness of a layer of ITO; the structuring of this layer of ITO is not described. A layer with a low refractive index is deposited above the upper electrode to improve the purity of the color.

U.S. Patent Publication No. 2012/0229014 (Seiko Epson) describes yet another approach, similar to that described in EP 1 672 962 B1, with one, two or three layers of TCO according to the color of the group of pixels. To avoid too great a difference in height it is proposed to deposit a dielectric smoothing layer. The problem of this structure is the small optical aperture of the pixels. The method for structuring these layers is not described.

A different approach is proposed in the patent application U.S. Patent Publication No. 2006/0138945 (Samsung). The pixelized part of the optical cavity is located outside of the OLED device, above the upper electrode. The transparent spacers of a chosen thickness are created by a technique of thermal transfer printing. This technique does not appear to be of sufficient industrial reliability for pixels of a size of several micrometers; moreover it would be desired to avoid making a deposit above the OLED stack by a technique that involves a mechanical pressure and/or significant heating, since the OLED stack is rather fragile. Another disadvantage of this approach lies in the optical absorption of the upper electrode made of TCO.

Yet another approach is described in U.S. Patent Publication No. 2012/0241782 A1 (Sony). The thickness of the optical cavity is modulated by a structuring of a hole transport layer that is part of the OLED stack. This does not solve the problem of the great industrial difficulty of structuring into pixels the deposit of the organic layers forming the OLED stack for a size of pixels smaller than about twenty μm.

U.S. Patent Publication No. 2016/0211479 (Seiko Epson) introduces the idea of modulating the thickness of the optical cavities with pixelized dielectric transparent layers (such as $SiO_2$ or SiN). Several embodiments for the modulation of the thickness are described: it is possible to use a layer of TCO (for example ITO), or a dielectric layer (such as silica) disposed between the lower reflector and the electrode made of ITO. However, no method for structuring this layer of TCO and this dielectric layer into groups of pixels is described. The deposition of a dielectric layer also requires making holes for contact with the lower electrode, which complicates the method for manufacturing such a device.

A more concrete embodiment of this idea is described in U.S. Patent Publication No. 2015/0060811A1 (Seiko Epson) for a structure with a transparent layer ($SiO_2$ or SiN) in a reflector/spacer/transparent electrode (ITO)/OLED stack/ semitransparent electrode structure. It is noted that ITO has a non-negligible optical absorbency. U.S. Pat. No. 9,972, 804B2 (Seiko Epson) gives another alternative of this concept.

As an alternative, the aforementioned document U.S. Patent Publication No. 2016/0211479 proposes modulating the thickness of the hole injection layer of the OLED stack; this once again poses the problem of the structuring of this layer into pixels of a size smaller than about twenty μm.

It is noted that the prior art does not offer a satisfactory solution to generate the primary colors RGB by interference from a white OLED stack common to the RGB pixels. The same problem arises for other optoelectronic devices, such as optical sensors, the photosensitive layer of which is an OLED stack; such a device is described in WO 2017/029 223 (Technische Universität Dresden). European Patent Publication No. EP 3 671 849 (Commissariat à l'énergie atomique et aux énergies alternatives) describes a device in which optical spacers are made for each pixel color using bilayers made of various transparent oxides. This method includes a complex succession of steps of wet etching aimed at the selective removal of layers of transparent oxides.

The goal of the present invention is to propose an optoelectronic device, in particular an OLED microdisplay, that has groups of pixels for the primary colors RGB of a very small size (of approximately 3 μm to 5 μm) on the basis of a common white-emission OLED stack, preferably in top-emission geometry. This device must have good optical efficiency, excellent durability, and must be able to be manufactured by a reliable industrial method that has good industrial performance, and which allows to obtain good dimensional control of the pixels, good homogeneity of the optical spacers through the pixel as well as good homogeneity through the substrate.

SUMMARY

According to the invention the problem is solved by an optoelectronic device that has pixels, wherein a photoactive stack of layers is disposed between the two reflectors of an optical cavity, and wherein the optical thickness of said optical cavity is modulated on the scale of the pixel. Such a structure allows the generation (in the case of an emissive device) or the detection (in the case of a detection device) of light of a given color inside the optical cavity, said color being determined by the optical length of the spectral cavity.

The optoelectronic device thus comprises a plurality of groups of pixels that differ by the optical length of their optical cavity. According to an essential feature of the invention, the optical cavity comprises, for at least one of the groups of pixels, a bilayer formed by two different transparent and conductive layers, which differ by their resistance to a wet etching treatment (which have, in other words, a different etching rate with respect to a liquid bath); this allows during the method for manufacturing the device the selective wet etching of that of the two layers that has the highest etching rate.

More precisely, each of said bilayers is formed by a first transparent and conductive layer of a first transparent and conductive material, and by a second transparent and conductive layer of a second transparent and conductive material, in direct contact with said first transparent and conductive layer, said first material being different than said second material. For each of these bilayers said first conductive and transparent layer, counted from the substrate of the optoelectronic device, has a lower resistance to a wet etching treatment than said second conductive and transparent layer.

A first object of the invention is an optoelectronic device comprising a substrate and a stack of organic layers comprising at least one active layer that can be a light-emitting layer or a photodiode, disposed between a reflective surface, or between the surface of a transparent layer deposited directly on said reflective surface, and a semitransparent and semi-reflective surface disposed facing one another at a given distance and forming an optical cavity of a given optical length d, and said device being characterized in that it comprises at least three groups of pixels, each group of which is characterized by a cavity of a different optical length, said cavity comprising a number of bilayers arranged between said substrate and said stack of organic layers, each bilayer being formed by a first transparent and conductive layer of a first transparent and conductive material, and by a second transparent and conductive layer of a second transparent and conductive material, in direct contact with said first transparent and conductive layer, said first material being different than said second material, and said device being characterized in that:
  for a first group of pixels the number of bilayers is zero,
  for a second group of pixels, the number of bilayers is one,
  for a third group of pixels, the number of bilayers is two or one, but in the latter case, said first layer of the bilayer associated with the third group of pixels is thicker than that of the second group of pixels,
  for each additional group of pixels, if present, the number of bilayers increases by one with respect to the previous group or remains the same, but in the latter case, said first layer of the bilayer associated with the additional group of pixels is thicker than that of the preceding group of pixels,
  knowing that the counting of the groups into first, second, third and, if necessary, so on follows an increasing order of the value of d, and
  said device being characterized in that for each of these bilayers said first conductive and transparent layer, counted from said substrate, has a lower resistance to a wet etching treatment than said second conductive and transparent layer. For each group of pixels beyond the first, at least said first layer of the bilayer farthest from the substrate is protected laterally by said second bilayer layer.

In one embodiment, for each group of pixels beyond the first, said first layer of the bilayer farthest from the substrate is totally encapsulated by said second layer of the bilayer.

In another embodiment, compatible with the preceding one, for each group of pixels beyond the first, said first layer of all the bilayers is totally encapsulated by a layer of a second transparent and conductive material.

Said reflective surface can be covered by a layer of said second transparent and conductive material; this layer is not therefore taken into account in the counting of the layers forming a bilayer.

Said wet etching treatment is a treatment with an aqueous solution of tetramethylammonium hydroxide at 2.38% by weight at ambient temperature.

In a very advantageous embodiment, in each of said bilayers, said first transparent and conductive layer has a specific etching rate $V1$ that is at least ten times greater, preferably at least one hundred times greater, and even more preferably at least one thousand times greater than the specific etching rate $V2$ of said second transparent layer.

Said transparent and conductive materials are typically oxides of at least one metal element (TCO—Transparent Conductive Oxide). Said first transparent and conductive material (also called "soft TCO" here) can be selected in the group formed by: ZnO; the doped oxides containing ZnO, the doping preferably being with gallium and/or with aluminum and/or with boron and/or with beryllium; indium oxide; the doped oxides containing indium oxide, the doping preferably being with tin. Said second transparent and conductive material (also called "hard TCO" here) can be selected from the group formed by: $SnO_2$, doped $SnO_2$, this doping preferably being with arsenic and/or with fluorine and/or with nitrogen and/or with niobium and/or with phosphorus and/or with antimony and/or with aluminum and/or with titanium.

According to an advantageous embodiment, said stack of organic layers is in direct contact with, on the one hand, said reflective surface or a transparent layer deposited on said reflective surface, and/or, on the other hand, with said semi-reflective surface.

Said stack of organic layers forms a continuous coating over all the pixels. Typically, a semitransparent and conductive layer is deposited above said stack of organic layers; it acts as an upper electrode. Said stack of organic layers, and preferably also said semitransparent and conductive layer, each form a continuous coating over all the pixels. The individual addressing of the pixels can thus be carried out via the lower electrode, which is structured at the level of the pixel ("pixelized"). Sais substrate of the optoelectronic device is advantageously a substrate of the CMOS type, provided with circuits allowing an individual addressing or reading of the pixels.

The optoelectronic device according to the invention can be made in the form of an emissive device, which is typically an OLED microdisplay, wherein the organic stack comprises an electroluminescent layer, or in the form of a detection device, which is typically a multispectral light sensor. In the latter case the organic stack comprises a photodiode, of the OPD (for Organic Photodetector) type.

Another object of the present invention is a manufacturing method for an optoelectronic device according to the invention, wherein:

first a first transparent and conductive layer of a first transparent and conductive material is deposited on said first reflective surface or on a transparent and conductive layer of a second material deposited on said first reflective surface;

a first mask is deposited which defines a second and a third group of pixels and protects their locations;

said first transparent and conductive layer is removed by wet etching in the places not protected by said first mask, these non-protected places comprising the location intended for a first group of pixels, and said first mask is removed;

a first transparent and conductive layer of a second transparent material is deposited;

a second transparent and conductive layer of a first transparent and conductive material is deposited;

a second mask that defines said third group of pixels and protects their locations is deposited;

said transparent and conductive layer of a first transparent and conductive material is removed by wet etching in the places not protected by said second mask, these non-protected places comprising the location intended for said second and said first group of pixels, and said second mask is removed;

a second transparent and conductive layer of a second transparent and conductive material is deposited;

a third mask that defines said first, second and third group of pixels and protects their locations is deposited;

said first and second layer of a second transparent and conductive material as well as said reflective layer and, if it is present, said layer of said second transparent and conductive material covering it are removed by dry etching in the places not protected by said third mask.

In such a manufacturing method for an optoelectronic device with three groups of pixels, the method can be continued by the following steps: a filling element is deposited in each space between two neighboring pixels; and a stack of organic layers common to all the pixels is deposited, a semi-reflective electrode layer, common to all the pixels, is deposited above said stack of organic layers.

Advantageously, the deposition of the transparent and conductive layers of said second transparent and conductive material is carried out by the technique of atomic layer deposition.

The deposition of the masks is carried out by the deposition of a photosensitive resin, according to microlithographic techniques known to a person skilled in the art.

DRAWINGS

FIGS. 1 to 7 illustrate for comparison an embodiment of a method and device that is not part of the prior art, but which does not solve the problem addressed. FIGS. 1 to 6 schematically show a transverse cross-section through an optoelectronic device at various stages of its manufacturing; this device has three groups of pixels.

FIGS. 8 to 42 illustrate certain aspects of the method and device according to the invention. They schematically show a transverse cross-section through optoelectronic devices according to the invention at various stages of their manufacturing.

FIGS. 1(a) to 1(f) illustrate in six episodes a first sequence of steps of a method for manufacturing a device of the OLED microdisplay type having three groups of pixels.

FIG. 2 illustrates a second sequence of method steps that follows those of FIG. 1.

FIG. 3 illustrates a third sequence of method steps that follows those of FIG. 2.

FIG. 4 illustrates a fourth sequence of method steps that follows those of FIG. 3.

FIG. 5 illustrates a fifth sequence of method steps that follows those of FIG. 4.

FIG. 6 illustrates a sixth sequence of method steps that follows those of FIG. 5.

FIG. 7 shows a scanning electron micrograph of a device that shows the step after FIG. 4. The width of each pixel is approximately 4.5 μm.

FIG. 8 illustrates a first sequence of steps of a method according to the invention for manufacturing a device of the OLED microdisplay type according to the invention, having two groups of pixels.

FIG. 9 illustrates a second sequence of method steps that follows those of FIG. 8.

FIG. 10 illustrates a third sequence of method steps that follows those of FIG. 9.

FIG. 11 illustrates a fourth sequence of method steps that follows those of FIG. 10.

FIG. 12 illustrates a fifth sequence of method steps that follows those of FIG. 11.

FIG. 13 illustrates a sixth sequence of method steps that follows those of FIG. 12.

FIG. 14 illustrates a seventh sequence of method steps that follows those of FIG. 13.

FIG. 15 illustrates an eighth sequence of method steps that follows those of FIG. 14.

FIG. 16 illustrates a more detailed view of the stack of the organic layers of a device of the OLED microdisplay type according to the invention, similar to that presented in FIGS. 8 to 15.

FIG. 17 illustrates an alternative of the device shown in FIG. 16.

FIG. 18 illustrates another alternative of the device shown in FIG. 16.

FIG. 19 illustrates yet another alternative of the device shown in FIG. 16.

FIG. 20 illustrates a first sequence of steps of an embodiment of the method according to the invention for manufacturing a device of the OLED microdisplay type according to the invention, having three groups of pixels.

FIG. 21 illustrates a second sequence of method steps that follows those of FIG. 20.

FIG. 22 illustrates a third sequence of method steps that follows those of FIG. 21.

FIG. 23 illustrates a fourth sequence of method steps that follows those of FIG. 22.

FIG. 24 illustrates a fifth sequence of method steps that follows those of FIG. 23.

FIG. 25 illustrates a sixth sequence of method steps that follows those of FIG. 24.

FIG. 26 illustrates a seventh sequence of method steps that follows those of FIG. 25.

FIG. 27 illustrates an eighth sequence of method steps that follows those of FIG. 26.

FIG. 28 illustrates a more detailed view of the stack of the organic layers of a device of the OLED microdisplay type according to the invention, similar to that presented in FIGS. 20 to 27.

FIG. 29 illustrates an alternative of the device shown in FIG. 28.

FIG. 30 illustrates another alternative of the device shown in FIG. 28.

FIG. 31 illustrates another alternative of the device shown in FIG. 27.

FIG. 32 illustrates yet another alternative of the device shown in FIG. 27.

FIG. 33 illustrates a first sequence of steps of another embodiment of the method according to the invention for manufacturing a device of the OLED microdisplay type according to the invention, having three groups of pixels.

FIG. 34 illustrates a second sequence of method steps that follows those of FIG. 33.

FIG. 35 illustrates a third sequence of method steps that follows those of FIG. 34.

FIG. 36 illustrates a fourth sequence of method steps that follows those of FIG. 35.

FIG. 37 illustrates a fifth sequence of method steps that follows those of FIG. 36.

FIG. 38 illustrates a sixth sequence of method steps that follows those of FIG. 37.

FIG. 39 illustrates a seventh sequence of method steps that follows those of FIG. 38.

FIG. 40 shows a scanning electron microscopy micrograph of a cross-section through a device according to an embodiment of the invention at an intermediate stage of manufacturing.

FIG. 41 illustrates an alternative of a device according to the invention.

FIG. 42 illustrates another alternative of a device according to the invention carrying out the same function as that of FIG. 41, but with a different structure.

DESCRIPTION

Unsuccessful Attempts to Solve the Problem Addressed

The inventors have realized that the solutions based on the use of structured dielectric layers as optical spacers require complex methods, such as the creation of conductive vias (in electronics, in an integrated circuit, a via is a metallized hole through an insulating layer which allows to establish an electric link between two levels of metal) or the use of methods of the thermal transfer type. For the same reason, the inventors have ruled out the use of the elements of the dielectric multilayer type.

The inventors have attempted to take as a starting point the solutions based on the use of conductive transparent layers (TCO, for example ITO, ZnO, $SnO_2$) as an optical spacer, as described in particular in the document EP 1 450 419 cited above. However, the practical creation of the structure described in this document turned out to be very difficult, for several reasons.

Firstly, to be able to guarantee stable primary colors through the substrate (which is typically a silicon wafer having a diameter of 200 mm or 300 mm, with circuits prepared by the CMOS technology which are configured to address the pixels), a very good uniformity of the thickness of the optical cavities, of approximately 98% to 99%, is required, which is difficult to achieve with deposition methods as described in the prior art, such as cathode sputtering or chemical vapor deposition (CVD, or PECVD, i.e. Plasma Enhanced Chemical Vapor Deposition). However, the use of the ALD (Atomic Layer Deposition) technique allows to obtain such a homogeneity of the thickness. However, it can only be applied to a limited number of TCO materials, such as ZnO, AZO (which is a more conductive alternative of ZnO), as well as $SnO_2$.

Secondly, the creation of three structured layers of TCO to form groups of pixels with three different optical thicknesses turns out to be rather difficult. As indicated above, European Patent Publication No. EP 1 672 962 includes the detailed description of a method based on three steps of deposition and of photolithography of resin, an etching and a stripping of these three layers of resin. With several additions and modifications, this can be translated into a process flow diagram shown by the images FIGS. 1(a) to 1(f).

The starting point is a substrate of the CMOS type (for example on a silicon wafer), with as a last level the metal for forming the pixels, here aluminum coated with a fine layer of TiN as protection against oxidation.

In a first sequence of steps illustrated in FIG. 1(a), the starting point (state (a)) was a substrate of the CMOS type 10 coated with a layer of $Si_3N_4$ or of $SiO_2$ 11 (approximately 200 nm) and with a base layer of reflective electrode 12; said base electrode included a layer of aluminum (approximately 200 nm) sandwiched between a first, lower layer of TiN 13 (approximately 50 nm), and a second, upper layer of TiN 15 (approximately 7 nm).

On the second layer of TiN 15, three layers of TCO 16, 18, 20 (AZO or ZnO) were successively deposited by ALD (states in FIGS. 1(b), 1(d), and 1(f)), with alternation of the deposition and of the lithography (states in FIGS. 1(c) and 1(e)) of three layers 17, 19, 21 of photosensitive resins (more routinely called "photoresist"), in order to create three groups of pixels (R, G and B). FIG. 2 shows the result after the third step of photolithography.

It is noted that FIGS. 1(a) to 1(f) only shows, for simplification reasons, two pixels each belonging to a different group, whereas FIGS. 3 to 6 effectively show the three groups of pixels.

In a second sequence of steps illustrated in FIGS. 3 and 4, the dry etching of all the layers including the reflective electrode 12 was carried out, by using the three layers of photosensitive resin (photoresist) 17, 19, 21 as a mask in order to etch the TCO layers 16, 18, 20 according to the nature of the pixel and in order to separate the pixels; this is illustrated in FIG. 3. The photosensitive resin was then stripped by a method known by the name of wet stripping (FIG. 4).

In a third sequence of steps illustrated in FIG. 5, a photosensitive resin 22 was deposited and defined by lithography to fill the space between the pixels and to planarize the surface.

In a fourth sequence of steps illustrated in FIG. 6 a white-emission OLED stack 23 with a semitransparent common electrode 24 at the top was deposited. The thicknesses and the positions of the emitters were optimized in order to create optical cavities to extract R, G, B primaries with optimal efficiency. Three groups of pixels 25, 26, 27 R, G, B, addressable individually via the circuits that are part of the CMOS substrate, are thus obtained; these circuits as well as the manner of establishing the contact between them and the lower electrode of the pixels 12 are known, are not part of the invention and will not be specified here.

It was found that this method is not usable in industrial production, for three reasons.

First of all, the control of the final thickness of the TCO layers is not satisfactory. Although the deposition by ALD allows to control the thickness of the TCO layers with a precision of 1%-2%, and leads to a very good uniformity over the surface area of the substrate, this thickness is reduced during the structuration method. It is in particular the step of stripping the photosensitive resin (i.e. the step that leads to the structure shown in FIG. 4) that attacks the TCO layer in a manner that is difficult to control. Indeed, the dry etching method (RIE or IBE) hardens the photosensitive resin, which thus requires a wet stripping powerful enough to be able to remove the resin; this wet stripping also attacks the TCO.

Then, it is observed that the edge of the pixel is degraded. Indeed, during the step that leads from the state (c) to the state (d) in FIG. 1, and during the step that leads from the state (e) of FIG. 1 to the state (f), the deposition of the TCO occurs partly on the vertical sides of the studs of photosensitive resin 17 and 19. Since the deposition by ALD is perfectly conformal, this leads to a formation of vertical walls made of TCO that partly resist the stripping of the photosensitive resin. This is visible in FIG. 7 which shows a scanning electron micrograph: rectangular boxes with vertical walls of TCO are clearly visible, while the inside of the boxes is empty; each of these boxes represents a pixel. To remove these vertical walls, an additional wet etching is required, which degrades the uniformity of the TCO at the edge of the pixel. This has a negative effect on the optical characteristics of the pixels, and more generally on the reliability of the optoelectronic device.

And finally, it is observed that the characteristic of the OLED pixel is degraded. With respect to a use of the original pixel metal (Al/TiN), it is found that the operating voltage of the OLED (deposited on the structure with the structured TCO layers) is increased from 1V to 2V, which is caused by a poor injection of the carriers (holes) of the TCO layer in the OLED.

In order to improve the control of the thickness, another type of TCO was used, in this case $SnO_2$, which turned out to be significantly more resistant to wet etching than the TCOs of the ZnO or AZO type. Another advantage of the $SnO_2$ is that it does not degrade the characteristics of the OLED stacks. However, the inventors were not able to find a method of wet etching allowing to completely remove the vertical walls created during the method of ALD deposition. Consequently, this new approach does not allow to solve the problem addressed: this combination of the teachings of the documents EP 1 450 419 and EP 1 672 962 leads to an impasse.

DESCRIPTION OF CERTAIN EMBODIMENTS OF THE INVENTION

It is retained from the experiment described above that to develop a method that allows good control of the final thickness and good homogeneity of the pixel without degradation of the edge the structure of the device must be modified. It is also retained that depositions of TCO by ALD on the photosensitive resin must be avoided, since this leads to the formation of vertical walls at the edge of the pixel, and that hardening of the photosensitive resin by dry etching, which makes it very resistant to stripping, must be avoided.

According to an essential feature of the present invention, a stack of at least two different layers of TCO, which differ by their resistance to etching, in particular to wet etching, are used as an optical spacer: the "hard" TCO is more resistant to etching than the "soft" TCO.

The soft TCOs, among which are found in particular ZnO and AZO, are etched very well via wet etching with a dry stripping of the photosensitive resin, for example via $O_2$ plasma, after, and this does not affect their thickness. However, they must be protected during the step of dry etching to separate the pixels, and during the wet stripping of the photosensitive resin. It is noted that their use as an anode for the OLED also leads to an increase in the operating voltage.

The hard TCOs, among which is found in particular $SnO_2$, are very resistant in particular to wet etching, and they can be etched only by dry etching. Moreover, they function well as an anode for the OLED stack, with a perfect conservation of the operating voltage compared to an anode made of Al/TiN.

According to this essential feature of the invention, a layer of soft TCO is mainly used as an optical spacer, but this layer is protected by a fine layer of hard TCO that also provides the interface towards the stack of organic layers of the device (OLED layers or photosensitive layers).

The concept of "soft" and "hard" TCO refers here to a reference wet stripping treatment (also called wet "etching" treatment), usually used in microelectronics, namely a stripping with an aqueous solution of tetramethylammonium hydroxide (CAS No: 75-59-2) at 2.38% by weight; such a product is commercially available, for example from the company ThermoFischer Scientific™ (electronic grade, catalogue no 44940). This wet etching is typically carried out at ambient temperature. According to this concept of "soft" and "hard" TCO, a "hard" TCO is a TCO that resists significantly better to such a wet etching treatment than a "soft" TCO, this resistance being able to be expressed by the specific etching rate in identical conditions. In the context of the present invention, regardless of the chemical nature of these layers of TCO, they must be selected with respect to one another in such a way that this difference in resistance to said reference wet etching treatment is respected. It should be specified that in the present context, the terms "hard" and "soft" do not refer to mechanical characteristics, but only to the resistance to wet etching.

Of course, the invention is not limited to TCOs that are "hard" and "soft" with respect to this reference treatment indicated above. In the method according to the invention it is possible to use other products and etching methods, which must nevertheless be selected in such a way that the TCOs that are, with respect to one another, respectively, "soft" and "hard" in the conditions of the reference treatment be also, with respect to one another, respectively, "soft" and "hard" in the conditions of the etching treatment chosen.

In the same optoelectronic device according to the invention, it is not necessary for all the layers of "hard" TCO to have the same chemical composition, and for all the layers of "soft" TCO to have the same composition, provided that in the wet etching conditions selected in the method according to the invention that are used by a given step, the layers of TCO in question behave like a layer of hard TCO and like a layer of soft TCO.

It is known that the resistance of a TCO can depend on the deposition technique. In the context of the present invention, an advantageous deposition technique is the technique of atomic layer deposition (ALD).

Preferably, in the context of the present invention, the hard TCO, the soft TCO and the etching treatment are chosen in such a way that the etching rate of the hard TCO is less than a tenth of the etching rate of the soft TCO, more preferably less than a hundredth, and even more preferably less than a thousandth.

For the soft TCO the etching rate (typically expressed in nm/min) must be adapted to the wet etching method used. If the etching rate is too high, the time between the end of the etching and the rinsing risks inducing an overetching difficult to control; the etching rate depends on the chemical nature of the TCO, its deposition method and the nature of the etching treatment (in particular the etching agent, its concentration and the temperature).

Typically, the "soft" TCOs usable for carrying out the present invention are TCOs containing ZnO, this ZnO being able to be doped, for example with gallium (oxide called GZO), with aluminum (AZO), with boron, and/or with beryllium. Another typical "soft" TCO system is the TCO containing indium oxide, which can be doped, in particular with tin; such an oxide known by the acronym ITO (Indium Tin Oxide) is widely used in microelectronics and optoelectronics. ITO cannot be deposited by ALD; indium oxide can be deposited by ALD, but this is a rather difficult method to control to guarantee correct stoichiometry.

Typically, the "hard" TCOs usable to carry out the present invention are TCOs containing $SnO_2$, this $SnO_2$ being able to be doped, for example with arsenic, with fluorine, with nitrogen, with niobium, with phosphorus, with antimony.

A first embodiment is described here with two groups of pixels of a different color, designated here by R and G.

In reference to FIG. 8, a substrate 150 is provided, in this case a silicon wafer with circuits structured according to the CMOS technology which are configured to address the pixels (or read the voltage or the current of the pixels in the case of a sensor); this technology is known as such and will not be explained here. This substrate 150 includes a layer of insulant 151 which can in particular be an oxide, a nitride or an oxynitride; typically $Si_3N_4$ is used. The electric contacts between the pixels are taken via vertical channels made through this layer of insulant via etching; this is also known.

The lower reflective electrode 152 is deposited on this layer of insulant 151. This lower reflective electrode 152 can include one or more layers. It can for example be made of silver, aluminum, copper, chromium or another metal with strong reflectivity, and in this case a single layer can suffice. It can also include several layers, as was described above and as illustrated in FIG. 8. In this respect, it can include for example a metal layer 153 (typically aluminum) sandwiched between a first (lower) layer 155 and a second (upper) layer 154. These first 155 and second 154 layers are conductive, and at least said second layer is also transparent 154 if it is not made of metal material; they can be made of titanium nitride, with a thickness typically of approximately 50 nm for the lower layer 155 and of approximately 7 nm for the upper layer 154. This thus leads for the lower electrode 152 to a TiN/metal/TiN structure (for example, TiN/Al/TiN). Alternatively, the second (upper) layer 154 can be made of silver; this alternative is preferred with respect to titanium nitride since silver has very good optical reflectivity, and the interface with the TCO that will be deposited on said upper layer 154 in the sequence of steps that follows will be of good quality. Said layer of silver can also be deposited above said second (upper) layer 154 made of nitride, which gives a TiN/metal/TiN/silver structure, for example, TiN/Al/TiN/Ag, listed from bottom to top.

In a first sequence of steps of the method according to the invention schematically illustrated in FIG. 8, a first layer 156 of TCO is deposited on this lower reflective electrode 152. This layer of TCO must be easy to etch by wet etching, it is thus called here a layer of "soft" TCO, as opposed to a layer of TCO resistant to wet etching, which is called here a layer of "hard" TCO. In general, in the context of the present invention, a fine layer of "hard" TCO (not shown in the drawings), called here "base hard TCO layer", which protects the lower electrode 152 can be interposed between the upper surface of the lower reflective electrode 152 and said first layer of TCO 156 (made of "soft" TCO). As soft TCO for example a layer of AZO, of ZnO or of ITO can be used, and as "hard" TCO a layer of $SnO_2$.

Said fine layer of hard TCO which protects the lower electrode 152 is visible in FIG. 31 (reference number 680) and in FIGS. 42 and 43, and will be discussed in greater detail in this context. It should be noted that if this layer 680 is present, it is not part of what is called here "bilayer": a "bilayer", as this term is used in the present application, always comprises a first layer (counted from the substrate) of soft TCO and a second layer of hard TCO.

As illustrated in FIG. 9, in a second sequence of steps a structured deposit 158 of photosensitive resin is created on this layer 156 of soft TCO by photolithographic methods known to a person skilled in the art. The spacing $d_1$ between two neighboring zones 158a, 158b of photosensitive resin corresponds to the spacing between two neighboring pixels. In this FIG. 9, like for the following drawings, in order to not overload these drawings, the lower electrode 152 is no longer shown with its three layers which are the first (lower) layer of nitride 155, the metal layer 153 and the second (upper) layer of nitride 154, but as a single layer with the numerical reference 152.

In a third sequence of steps the wet etching of the layer 156 of soft TCO is carried out. In the case mentioned above in which a layer of hard TCO was interposed between the upper surface of the lower electrode and the first layer of soft TCO, the former layer is not removed by said wet etching treatment.

Then the photosensitive resin 158 is removed by a dry method, which is typically an oxygen plasma; this results in the structure schematically shown in FIG. 10.

In a fourth step a second layer 160 of TCO is deposited. This layer must be significantly more resistant to the wet etching than the layer of soft TCO 156; for this reason this layer is called a layer of "hard" TCO. As indicated above, a layer of $SnO_2$ can for example be used. The resulting structure is schematically illustrated in FIG. 11. This layer must be very fine, it advantageously has a thickness between 3 nm and 12 nm.

In a fifth sequence of steps a structured deposit 162 of photosensitive resin is created on this layer 160 of TCO, in such a way that the spacing $d_2$ between two neighboring zones 162a, 162b of photosensitive resin correspond to the spacing between two neighboring pixels R, G. This is schematically illustrated in FIG. 12. It is noted that this structured deposit of photosensitive resin comprises a deposit 162a that is deposited above the structured layer 156 of soft TCO, and another photosensitive deposit 162b that is deposited between two neighboring zones 156a, 156b of soft TCO.

In a sixth sequence of steps the dry etching of all of the layers 160 of hard TCO, of possible residues of the soft TCO layer 156 and of the reflective electrode 152 is carried out to separate the pixels, followed by a wet stripping of the photosensitive resin 162. Said dry etching is advantageously carried out by RIE (Reactive-Ion Etching) or IBE (Ion Beam Etching). A structure schematically illustrated in FIG. 13 is thus obtained.

In a seventh sequence of steps a filling element 164 is deposited in the space between two neighboring pixels, for example by photolithographic techniques. This is schematically illustrated in FIG. 14.

In an eighth sequence of steps the OLED stack 170, common to all the pixels, and a semi-reflective upper electrode 166 (also called top electrode) which is also common to all the pixels are deposited on this structured surface. This is schematically illustrated in FIG. 15, which schematically shows two groups of pixels 168a, 168b, each formed by two types of pixels 167a, 167b of a different color. Said upper electrode 166 must be semi-reflective and semitransparent; it forms one of the two reflectors of the optical cavity. In the case of a top-emission OLED microdisplay, it is through it that the light generated by the OLED stack leaves the optoelectronic device, as will be explained in greater detail below; if the optoelectronic device according to the invention is a detector, it is through it that the light enters the device to be detected by the organic stack that is thus located in the place of the OLED stack.

An optoelectronic device with two groups of pixels 167a, 167b is thus obtained, each group of pixels having an optical cavity of a different optical thickness, designated $d_R$ and $d_G$, respectively. The optical cavities are formed between the lower electrode 152 of the pixel, which is reflective, and the semitransparent and semi-reflective electrode 166 at the top. The organic stack can be according to the destination of the optoelectronic device an emissive stack of the OLED type or a stack of the organic photodiode type. In this case, one of the pixels 167a is formed on a TCO layer that is formed from two layers 156, 160 of different TCO materials, one 156 soft, the other 160 hard, while the other of the pixels 167b is formed on a TCO layer that is only formed from a single layer 160 of TCO, which is a hard layer.

It is noted that even if the layer of TCO can be composed of two chemically different layers 156, 160, it acts in this optoelectronic device as a single optical spacer, and in this function it is designated here by the reference number 157 (visible in FIG. 16); the fact that it is composed of two chemically different layers 156, 160 of different hardness is motivated only by practical considerations in relation to the industrial production of reliable optoelectronic devices with high optical efficiency. The refractive index of the two layers of TCO 156, 160 is advantageously close to limit the loss of light by multiple reflections.

This device can be used to create a display screen with two primary colors, for example red (R) and green (G). It can also be used to create a light detector responding in two different spectral zones; in this case all the optical paths are inverted and the light-emitting OLED stack 170 is replaced by a light-detecting stack of layers.

It is observed that the dry etching of the sixth step is a directional etching that removes the hard TCO 160 in the space having a width d2 between two neighboring zones (see the passage from FIG. 12 to FIG. 13), but which does not remove the vertical walls (sides) of the layer of hard TCO 160, which remain visible in FIG. 13 for the pixels of the group of those which have the thickest optical cavity (thickness $d_R$ in FIG. 15). Thus, the sides of the layer of hard TCO 160 protect the sides of the layer of soft TCO 156b on which said layer of hard TCO 160 was deposited, during the steps of dry etching (sixth sequence of steps, see FIG. 13) and of deposition of the filling element 164 (seventh sequence of steps, see FIG. 14). Thus, an optical spacer, the layers of TCO 156b, 160 of which have an excellent geometric definition with clean and healthy edges is obtained by the method according to the invention.

FIG. 16 shows in a more precise and enlarged manner the layers of the OLED stack 170 for the two groups of pixels, 167a (R) and 167b (G). This OLED stack includes a second electrode (top electrode) 166 and one or more encapsulation layers (not shown in the drawings) in order to protect the device. Said upper electrode 166 must be semitransparent since it is through it that the light emitted by said optoelectronic device leaves the device if this is a light emitter, and it is through it that the light that must be detected by said device enters the device if this is a light detector.

FIG. 16 also shows a finer representation of the OLED stack, which is shown here with three assemblies of layers: a first assembly 171 successively includes, listed from bottom to top, a hole injection layer (abbreviated HIL), a hole transport layer (abbreviated HTL), and an electron blocking layer (abbreviated EBL). A second assembly 175 of layers includes the emissive layer(s) (abbreviated EML). A third assembly 179 of layers successively includes a hole blocking layer (abbreviated HBL), an electron transport layer (abbreviated ETL) and an electron injection layer (abbreviated EIL).

The optical thicknesses $d_R$ and $d_G$, as well as the optical position of maximum intensity of the emitting layer 175, $z_y$, are chosen so as to form for the pixels of the group G 167b a cavity that allows to extract a maximum of green light in the direction of the normal, and for the pixels of the group R 167a a maximum of red light. For this an OLED stack 170 emitting for example a spectrum with a peak in the yellow zone (abbreviated Y here) of the visible spectrum can be created.

Instead of using an OLED stack 170 with an emission peak in the yellow zone of the visible spectrum, an OLED stack 1700 with two different emitting layers 1751, 1752, in this case R and G, can also be used; such a device is illustrated in FIG. 17. In this case, the thicknesses $d_R$ and $d_G$, as well as the position of maximum intensity of the emitting layers 1751, 1752, respectively designated $z_R$ and $z_G$, are to be optimized in order to obtain maximum emission at the normal for the two groups of pixels 1670a, 1670b.

It is also possible to use an OLED stack of the tandem type, either with two Y cells (schematically illustrated in FIG. 18), or with an R cell and a G cell (schematically illustrated in FIG. 19). In the latter case, the order of the G and R cells can also be inverted (not shown in the drawings). In these cases, the thicknesses $d_R$ and $d_G$, as well as the position of maximum intensity of the emitting layers, $z_{Y1}$ and $z_{Y2}$ or $z_R$ and $z_G$, are to be optimized in order to obtain maximum emission at the normal for the two groups of pixels.

The structure of the stacks of the tandem type is illustrated in FIGS. 18 and 19; in these two drawings, the numbers of references that designate the same thing as in FIGS. 8 to 17 have been increased by 100. The OLED stacks 270 of the tandem type comprise two assemblies of stacks 2701, 2702, separated by a charge generation layer 274 (abbreviated CGL). Each of these two assemblies of stacks 2701, 2702 includes the three assemblies of layers presented in relation to FIG. 16, namely (from bottom to top): a first assembly 271, 276 of EBL, HTL and HIL layers, a second assembly 272, 278 including the EML emissive layer, and a third assembly 273, 279 comprising the EIL, HBL, ETL layers.

The optical thicknesses $d_I$, I=R, G are defined as the sum of the thicknesses e multiplied by the optical index n of all the layers that are located between the upper surface of the electrode 152 and the lower surface of the electrode 166. For example, with respect to FIG. 16 this gives:

$$D_R = n_{156}*e_{156} + n_{160}e_{160} + n_{171}e_{171} + n_{175}*e_{175} + n_{179}*e_{179}$$

$$D_G = n_{160}*e_{160} + n_{171}*e_{171} + n_{175}*e_{175} + n_{179}*e_{179}$$

In these equations the index of each parameter refers to the numerical reference used in FIG. 16.

In the same way, the optical position of the emission $z_J$, J=Y, R, G is defined as the sum of the thicknesses e multiplied by the optical index n of all the layers that are located between the position of maximum intensity of emission of the corresponding emitting layer and the lower surface of the electrode 166. For example with respect to FIG. 16 this gives, under the hypothesis that the maximum intensity of emission of the emitting layer 175 is located in the middle of the layer:

$$z_Y=0.5*n_{175}*e_{175}+n_{179}*e_{179}.$$

In this equation the index of each parameter refers to the numerical reference used in FIG. 16.

For example, in the geometry of FIG. 16, if the optical thickness $d_G$ is set to 102 nm, $d_R$ to 130 nm and the thickness $e_{160}$ of the layer of hard TCO 160 to 4 nm, the layer 156 of soft TCO must have an optical thickness of 28 nm which corresponds to a physical thickness of 15.5 nm if its optical index is 1.8, given that the organic stack 170 and the layer of hard TCO 160 are common to all the pixels (and thus have the same thickness for the pixel 167*a* and the pixel 167*b*).

In relation to FIGS. 20 to 27, a second embodiment with three groups of pixels 367*a*, 367*b*, 367*c* of a different color, designated here by R, G and B, will now be described. The reference numbers that designate the same thing as in FIGS. 8 to 17 have been increased by 200.

The first part of the method is analogous to that which was described above for the device with two colors, until the fourth sequence of steps inclusive, with a set of photolithography masks adapted to a geometry with three different groups of pixels. After the fourth sequence of steps, an intermediate product schematically shown in FIG. 20 is thus obtained. At the locations 367*a*, 367*b* of the groups of pixels R and G it has a structured layer of TCO, comprising a first layer 3561 of soft TCO and a first layer 3601 of hard TCO. At the location 367*c* of the group of the pixel B there is no soft TCO layer.

Then a second layer 3562 of soft TCO is deposited on the entire structure, as illustrated in FIG. 21. In the next step at the location 367*a* of the group of pixels R a layer of photosensitive resin 332*a* is deposited by known photolithographic techniques. This is illustrated in FIG. 22. Then a wet etching is carried out to selectively remove said second layer of soft TCO 3562 in the accessible places, i.e. not protected by the photosensitive resin 332*a*. The layer of hard TCO 3601 protects the first layer of soft TCO 3561 of the location 367*b* of the group of pixels G. Then the photosensitive resin 332*a* is removed by a dry etching method, typically with oxygen plasma.

Then a second layer 3602 of hard TCO is deposited on the entire structure, to arrive at the structure illustrated in FIG. 23. On this second layer 3602, using known photolithographic techniques, a structured layer 3620 of photosensitive resin is deposited, as indicated in FIG. 24. This layer of photosensitive resin 3620*a*, 3620*b*, 3620*c* protects each group of pixels 367*a*, 367*b*, 367*c* during the dry etching to separate the pixels. The object of this dry etching is to remove all of the layers of hard TCO 3601 and 3602, possible residues of soft TCO as well as the layer(s) of the reflective electrode 352 in the places not protected by the photosensitive resin, that is to say at the space between the pixels. Said dry etching can be ion beam etching, as mentioned above.

Then the layer of photosensitive resin 3620 is removed by a wet stripping method and the structure illustrated in FIG. 25 is thus obtained. A filling element 364, for example made of photosensitive resin, is then deposited in the space between two neighboring pixels, as described above; the result is illustrated in FIG. 26. On this structure first the OLED stack 370, then the common electrode 366, which must be semitransparent, are deposited. Three groups of pixels 367*a*, 367*b*, 367*c* with optical spacers with a different optical thickness for each of the three groups of pixels are thus obtained. This device is illustrated in FIG. 27.

It is noted, like in the first embodiment described in relation to FIGS. 8 to 15, that the edges (which are also called sides) of the layers of TCO of the optical spacers of the green 367*b* and red 367*a* groups of pixels are protected by a layer of hard TCO 3602. These sides can be vertical or inclined, which depends on the details of the manufacturing method; an example is shown in FIG. 40.

Moreover, as visible in FIG. 28, for the red pixel 367*a*, the optical spacer of which includes two layers of soft TCO 3561, 3562, it is noted that the upper layer of soft TCO 3561 is totally encapsulated by the lower layer of hard TCO 3601, the upper layer of hard TCO 3602 and the sides of said upper layer of hard TCO 3602. A sort of box of hard TCO is thus created, protecting the inner layer of soft TCO. Thus, the method according to the invention leads to optical spacers of high quality, excellent geometric definition, large homogeneity and good stability over time. The aforementioned FIG. 40 shows an example of such a "box" of hard TCO (in this case $SnO_2$) that protects the soft TCO (in this case AZO) of a green pixel (second group): the layer of AZO has a thickness of 45 nm.

A device according to the invention can be used to create a display screen with three primary colors, for example red (R), green (G) and blue (B), in order to create a color screen of the type known by the name "full color". For this, several embodiments are possible. For example an OLED stack 470 can be created comprising an assembly 575 of three different emissive layers 5712, 5710, 5711 emitting a white spectrum with three peaks in the blue, green and red ranges of the spectrum, which is protected by a second semitransparent electrode (top electrode) 466, and by one or more encapsulation layers (not shown in the drawings) in order to protect the device. Such a device is schematically shown in FIG. 28. In this example, the three emitting layers 5712, 5710, 5711 forming the assembly 575 of organic layers are in direct succession, the first 5712 and the third 5711 (counting from the bottom) being in contact with, respectively, a first assembly 571 and a third assembly 579 of organic layers, which have the same functions as the assemblies 171 and 179 explained above in relation to FIG. 16.

The result is thus a device with three groups of pixels 467*a*, 467*b*, 467*c*, each pixel group being characterized by an optical cavity having a different optical thickness, designated as $d_R$, $d_G$ and $d_B$ respectively. The cavities are formed between the electrode 452 of the pixel that is reflective, and the semitransparent and semi-reflective electrode 466 at the top. The thicknesses $d_R$, $d_G$ and $d_B$ as well as the position of maximum intensity of the emitting layer, $z_W$, are chosen so as to form for the group of pixels B 467*c* a cavity that allows to extract, from the light generated by the OLED stack, which can be a white light, a maximum of blue light in the direction of the normal, for the group of pixels G 467*b* a maximum of green light, and for the group of pixels R 467*a* a maximum of red light.

It is noted that in this drawing, the parameter $z_W$ refers to a white emission that results from the emission emanating from the light-emitting layers having a blue 5712, green 5710 and red 5711 color. For each of these three layers, the position of maximum intensity of the emitting layer can be defined, designated below by the parameters $z_B$, $z_G$ and $z_R$, respectively; these parameters are not shown in FIG. 28 in order to not overload it.

It is also possible to generate the white emission with a combination of a blue emitter and a yellow emitter (not shown in the drawings).

It is also possible to use an OLED structure of the tandem type, either with a cell emitting blue light B and a cell emitting yellow light Y, or with a cell emitting light B and a cell emitting red and green light RG. The first alternative is illustrated in FIG. 29, the second in FIG. 30.

In the tandem cell of FIG. 29, the OLED stack 570 comprises two OLED stacks 5701, 5702 separated by a charge generation layer 574. The first stack 5701 (counted from the substrate) has the succession of layers 571 HIL, HTL and EBL that was described above, then an emissive layer 572 (in this case with the blue emission color), then the succession of layers 573 EIL, ETL, HBL that was already described above.

The second stack 5702 has the same functional structure, with the layers of the succession of layers 576 HIL, HTL, EBL, an emissive layer 578 with an emission color (yellow) different than that of the stack 5701, and the succession of layers 579 HIL, ETL, HBL. The semi-reflective and conductive layer 566, common to all the pixels, forms both the upper reflector of the optical cavity and the common upper electrode of the device.

The tandem cell of FIG. 30 has a similar structure, except that in the second OLED stack 5702, the emissive layer 578 is not characterized by a yellow emission color, but is made in the form of two emissive layers 5781, 5782, the first of which emits in the red, the second in the green.

The order of the cells B and Y or B and RG can also be inverted with respect to that which is shown in these drawings. The thicknesses $d_R$, $d_G$ and $d_B$, as well as the position of maximum intensity of the emitting layers, $z_Y$ and $z_B$ or $z_{RG}$ and $z_B$, can be optimized in order to obtain a maximum emission at the normal for the three groups of pixels.

As already explained above, the optical thicknesses $d_I$, I=R, G, B are defined as the sum of the thicknesses e multiplied by the optical index n of all the layers that are located between the upper surface of the electrode 452/552 and the lower surface of the electrode 466/566. For example, with respect to FIG. 30 this gives:

$$D_R = n_{5561}*e_{5561} + n_{5601}*e_{5601} + n_{5562}*e_{5562} + n_{5602}*e_{5602} + n_{570}*e_{570}$$

$$D_G = n_{5561}*e_{5561} + n_{5601}*e_{5601} + n_{5602}*e_{5602} + n_{570}*e_{570}$$

$$D_G = n_{5601}*e_{5601} + n_{5602}*e_{5602} + n_{570}*e_{570}$$

In these equations the index of each parameter refers to the numerical reference used in FIG. 30.

In the same way, the optical position of the emission $z_J$, J=Y, R, G, RG, W is defined as the sum of the thicknesses e multiplied by the optical index n of all the layers that are located between the position of maximum intensity of emission of the corresponding emitting layer and the lower surface of the electrode 466/566. For example with respect to FIG. 30 this gives, under the hypothesis that the maximum intensity of emission of the emitting layers 572/578 is located in the middle of the layer:

$$z_{RG} = 0.5*n_{578}*e_{578} + n_{579}*e_{579}$$

$$z_B = 0.5*n_{572}*e_{572} + n_{573}*e_{573} + n_{574}*e_{574} + n_{576}*e_{576} + n_{578}*e_{578} + n_{579}*e_{579}$$

In these equations the index of each parameter refers to the numerical reference used in FIG. 30.

Tables 1 to 3 show the result of an optimization of the main parameters for various configurations. This optimization is aimed at the best optoelectronic performance, in particular a compromise between emission, efficiency and CIE emission spectrum, to determine the key parameters of the device, namely the thicknesses $d_R$, $d_G$, and $d_B$ and the position of maximum intensity of the emitting layers $z_W$ (white light for the geometry of FIG. 28), or $z_B$ and $z_Y$ (for the geometry of FIG. 29), or $z_B$, $z_G$ and $z_R$ (for the geometry of FIG. 30). This optimization is based on an average value of the optical index of the layers forming the organic stack of 1.7981 at the wavelength of 500 nm, given that the optical indices of the various organic layers are very close. It is also based on an optical index at 500 nm of the soft TCO (AZO in this example) of 1.92448293 and of the hard TCO ($SnO_2$ in this example) of 2.027. The references 8, 9, 14 and 15 refer to an emission of the first order for the yellow pixel (Y) and to an emission of the second order for the blue pixel (B).

TABLE 1

Geometry of FIG. 28 (RGB simple cell)

| Ref | order | d [nm] from | to | d [nm] from | to | d [nm] from | to | z [nm] from | to | z [nm] from | to | z [nm] from | to | z [nm] from | to | z [nm] from | to |
|---|---|---|---|---|---|---|---|---|---|---|---|---|---|---|---|---|---|
| 1 | 1 | 120 | 156 | 178 | 214 | 197 | 233 | 60 | 114 | 45 | 88 | | | 64 | 121 | 70 | 132 |
| 2 | 2 | 120 | 156 | 178 | 214 | 197 | 233 | 56 | 107 | 45 | 88 | 67 | 127 | | | | |

Reference 1: three emitters, namely R, G, B.
Reference 2: two emitters, namely B, Y.
The column "ord" indicates the order of the optical emission.

TABLE 2

Geometry of FIG. 29 (YB tandem cell)

| Ref | order | d [nm] from | to | $d_G$ [nm] from | to | d [nm] from | to | z [nm] from | to | z [nm] from | to |
|---|---|---|---|---|---|---|---|---|---|---|---|
| 3 | 1 | 120 | 156 | 178 | 214 | 197 | 233 | 45 | 88 | 67 | 128 |
| 4 | 2 | 336 | 372 | 451 | 487 | 509 | 564 | 260 | 310 | 57 | 124 |
| 5 | | 336 | 372 | 451 | 487 | 509 | 564 | 53 | 92 | 133 | 372 |
| 6 | 1(B), 2(Y) | 120 | 156 | 466 | 502 | 524 | 579 | 45 | 88 | 59 | 128 |
| 7 | 1(Y), 2(B) | 347 | 383 | 174 | 210 | 193 | 229 | 55 | 95 | 66 | 124 |

References 3, 5, 6 and 7: bottom cell = B, top cell = Y.
Reference 4: bottom cell = Y, top cell = B.

TABLE 3

Geometry of FIG. 30 (RG/B tandem cell)

| Ref | order | d [nm] from | d [nm] to | d [nm] from | d [nm] to | d [nm] from | d [nm] to | z [nm] from | z [nm] to | $z_G$ [nm] from | $z_G$ [nm] to | z [nm] from | z [nm] to |
|---|---|---|---|---|---|---|---|---|---|---|---|---|---|
| 8 | 1 | 120 | 156 | 178 | 214 | 179 | 233 | 24 | 109 | 36 | 150 | 39 | 163 |
| 9 | 2 | 336 | 372 | 451 | 487 | 509 | 564 | 235 | 335 | 23 | 146 | 25 | 169 |
| 10 |  | 336 | 372 | 451 | 487 | 509 | 564 | 34 | 112 | 316 | 439 | 356 | 508 |
| 11 | 1(B), 2(R, G) | 347 | 393 | 174 | 210 | 193 | 229 | 243 | 345 | 35 | 147 | 39 | 160 |
| 12 | 1(RG), 2(B) | 347 | 383 | 174 | 210 | 193 | 229 | 35 | 115 | 35 | 147 | 39 | 160 |

References 8, 10, 12: bottom cell = B, top cell = RG
References 9 and 11: bottom cell = RG, top cell = B Thus, according to a first specific embodiment that lends itself in particular to microdisplays, the optoelectronic device according to the invention has at least three groups of pixels, which are, respectively, pixels R (red), G (green) and B (blue), the pixels of each group having an emitting layer (or a photosensitive layer in the case in which said device is a photodetector), which emits (or detects) in the red, green or blue spectrum, respectively, with an optical thickness $d_B$ between approximately 110 nm and approximately 160 nm, an optical thickness $d_G$ between approximately 160 nm and approximately 220 nm, an optical thickness $d_R$ between approximately 190 nm and approximately 240 nm, a parameter designating the optical position of maximum intensity of white light $z_W$ between approximately 50 nm and approximately 130 nm (preferably between approximately 60 nm and approximately 115 nm), a parameter designating the optical position of maximum intensity of blue light $z_B$ between approximately 40 nm and approximately 100 nm (preferably between approximately 45 nm and approximately 90 nm), a parameter designating the optical position of maximum intensity of green light $z_G$ between approximately 60 nm and approximately 130 nm (preferably between approximately 65 nm and approximately 120 nm), and a parameter designating the optical position of maximum intensity of red light $z_R$ between approximately 65 nm and approximately 140 nm (preferably between approximately 70 nm and approximately 130 nm).

In an advantageous alternative of this embodiment, the optical thickness $d_B$ is between approximately 120 nm and approximately 155 nm, the optical thickness $d_G$ is between approximately 175 nm and approximately 215 nm, the optical thickness $d_R$ is between approximately 195 nm and approximately 230 nm, the parameter $z_W$ is between approximately 60 nm and approximately 115 nm (preferably between approximately 75 nm and approximately 100 nm), the parameter $z_B$ is between approximately 45 nm and approximately 90 nm (preferably between approximately 55 nm and approximately 80 nm), the parameter $z_G$ is between approximately 65 nm and approximately 120 nm (preferably between approximately 70 nm and approximately 110 nm), and the parameter $z_R$ is between approximately 70 nm and approximately 130 nm (preferably between approximately 80 nm and approximately 120 nm).

According to a second specific embodiment that lends itself in particular to microdisplays, the optoelectronic device according to the invention has at least three groups of pixels, which are, respectively, pixels R (red), G (green) and B (blue), the pixels of each group having a structure of the tandem type in which the bottom cell has an emitting layer (or a photosensitive layer) which emits (or detects) in the blue spectrum, and the top cell has an emitting layer (or a photosensitive layer) which emits (or detects) in the yellow or red and green spectrum, with an optical thickness $d_B$ between approximately 110 nm and approximately 160 nm (preferably between approximately 120 nm and approximately 155 nm), an optical thickness $d_G$ between approximately 160 nm and approximately 220 nm (preferably between approximately 175 nm and approximately 215 nm), an optical thickness $d_R$ between approximately 190 nm and approximately 240 nm (preferably between approximately 195 nm and approximately 230 nm), a parameter designating the optical position of maximum intensity of blue light $z_B$ between approximately 40 nm and approximately 90 nm (preferably between approximately 45 nm and approximately 85 nm), and a parameter designating the optical position of maximum intensity of yellow (or red and green) light $z_Y$ between approximately 60 nm and approximately 140 nm (preferably between approximately 65 nm and approximately 130 nm).

In an advantageous alternative of this embodiment, the optical thickness $d_B$ is between approximately 120 nm and approximately 155 nm, the optical thickness $d_G$ is between approximately 175 nm and approximately 215 nm, the optical thickness $d_R$ is between approximately 195 nm and approximately 230 nm, the parameter $z_B$ is between approximately 45 nm and approximately 85 nm (preferably between approximately 55 nm and approximately 80 nm), and the parameter $z_Y$ is between approximately 65 nm and approximately 130 nm (preferably between approximately 80 nm and approximately 115 nm).

According to a third specific embodiment that lends itself in particular to microdisplays, the optoelectronic device according to the invention has at least three groups of pixels, which are, respectively, pixels R (red), G (green) and B (blue), the pixels of each group having a structure of the tandem type in which the bottom cell has an emitting layer (or a photosensitive layer) which emits (or detects) in the blue spectrum, and the top cell has an emitting layer (or a photosensitive layer) which emits (or detects) in the yellow or red and green spectrum, with an optical thickness $d_B$ between approximately 320 nm and approximately 390 nm (preferably between approximately 330 nm and approximately 375 nm), an optical thickness $d_G$ between approximately 425 nm and approximately 500 nm (preferably between approximately 450 nm and approximately 490 nm), an optical thickness $d_R$ between approximately 500 nm and approximately 575 nm (preferably between approximately 510 nm and approximately 565 nm), a parameter designating the optical position of maximum intensity of blue light $z_B$ between approximately 45 nm and approximately 100 nm (preferably between approximately 50 nm and approximately 95 nm), and a parameter designating the optical position of maximum intensity of yellow (or red and green)

light $z_Y$ between approximately 120 nm and approximately 390 nm (preferably between approximately 130 nm and approximately 375 nm).

In an advantageous alternative of this embodiment, the optical thickness $d_B$ is between approximately 335 nm and approximately 375 nm, an optical thickness $d_G$ between approximately 450 nm and approximately 490 nm, an optical thickness $d_R$ between approximately 510 nm and approximately 565 nm, a parameter $z_B$ between approximately 55 nm and approximately 90 nm (preferably between approximately 60 nm and approximately 85 nm), and a parameter $z_Y$ between approximately 130 nm and approximately 375 nm (preferably between approximately 135 nm and approximately 370 nm).

In relation to FIGS. 33 to 39, another embodiment with three groups of pixels 767a, 767b, 767c of a different color, designated here by R, G and B, will now be described. The reference numbers that designate the same thing as in FIGS. 20 to 27 have been increased by 400.

The starting point is the intermediate product schematically shown in FIG. 33. It can be obtained by an alternative of the method described in relation to the intermediate product shown in FIG. 20 by using a set of photolithography masks adapted to this new embodiment. Thus after the fourth sequence of steps an intermediate product schematically shown in FIG. 33 is obtained. At the location 767b of the group of pixels G it has a structured layer of TCO, comprising a first layer 7561 of soft TCO and a first layer 7601 of hard TCO. At the locations 767a and 767c of the groups of pixels R and B, respectively, there is no layer of soft TCO below said first layer 7601 of hard TCO.

Then a second layer 7562 of soft TCO is deposited on the entire structure, as illustrated in FIG. 34. In a next step a layer of photosensitive resin 762a is deposited, by known photolithographic techniques, at the location 767a of the group of pixels R. This is illustrated in FIG. 35. Then a wet etching is carried out to selectively remove said second layer of soft TCO 7562 in the accessible places, i.e. not protected by the photosensitive resin 762a. The layer of hard TCO 7601 protects the first layer of soft TCO 7561 of the location 767b of the group of pixels G. Then the layer of photosensitive resin 762a is removed by a dry stripping method, typically with oxygen plasma.

Then a second layer 7602 of hard TCO is deposited on the entire structure, to arrive at the structure illustrated in FIG. 36. On this second layer 7602, using known photolithographic techniques, a structured layer 7620 of photosensitive resin is deposited, as indicated in FIG. 24. This structured layer of photosensitive resin comprises here three zones 7620a, 7620b, 7620c and thus protects each group of pixels 767a, 767b, 767c during the dry etching to separate the pixels. The object of this dry etching is to remove in the places not protected by the photosensitive resin 7620 all of the layers of hard TCO 7601 and 7602, possible residues of soft TCO, as well as the layer(s) of the reflective electrode 752 in the places not protected by the photosensitive resin, that is to say at the space between the pixels. Said dry etching can be ion beam etching, as mentioned above.

Then the layer of photosensitive resin 7620 is removed by a wet stripping method and the structure illustrated in FIG. 38 is thus obtained. A filling element 764, for example made of photosensitive resin, is then deposited in the space between two neighboring pixels, as described above; the result is illustrated in FIG. 39. On this structure the OLED stack and then the common electrode, which must be semitransparent, are then deposited. Three groups of pixels with optical spacers with a different optical thickness d for each of the three groups of pixels are thus obtained. This device is not illustrated by a drawing; it is similar to that of FIG. 27, except with regard to the stack of layers of hard and soft TCO on the pixel 367a.

This device can be used to create a display screen with three primary colors, for example red (R), green (G) and blue (B), in order to create a color screen of the type known by the name "full color", as described above.

The invention can be carried out in various other alternatives.

A first alternative is illustrated in FIG. 31: a fine layer 680 of hard TCO (such as $SnO_2$) has been interposed between the electrode of pixel 552 (i.e. the lower electrode which is reflective) and the first layer of soft TCO 3561 (which can be made of AZO). It follows that for each group of pixels 367a, 367b beyond the first group 367c, that is to say in this case for the second 367b and third 367a group, the first layer 3561, 3562 of all the bilayers is totally encapsulated by a layer 3601, 3602, 680 of a second transparent and conductive material: the hard TCO protects the soft TCO.

FIG. 41 schematically illustrates the principle of this alternative: it is noted that the pixel of the third group 367a has an optical spacer with a height h3 that is greater than the height h2 of the optical spacer of the pixels of the second group 367b. The optical spacer of the pixels of the third group 367a is formed by two bilayers, that of the pixels of the second group 367b by a single bilayer. Moreover, for each of these two groups, the layers of soft TCO 3561, 3562 are encapsulated by a layer of hard TCO 3601. According to an alternative of the method described above (this alternative not being described here in greater detail), it is possible to obtain a product with a different structure that carries out the same function; this structure is illustrated in FIG. 42: in this alternative the optical spacer of the pixels of the third group 367a has a height h2 identical to that of FIG. 41, but there is, for this third group of pixels 367a, only a single bilayer; the third group of pixels 367a has with respect to the pixels of the second group 367b a thickness of the layer of soft TCO 7562 that is greater (the relationship h3>h2 still applies). FIG. 40 shows an extract of such a structure according to FIG. 42: the thickness of the AZO layer (visible in the drawing) is 45 nm for the green pixel, and 95 nm for the red pixel (not visible in FIG. 40).

In a second alternative, which is compatible with all the other alternatives and all the embodiments described here, suitable colored filters 695a, 695b, 695c are added. This is schematically illustrated in FIG. 32. The presence of colored filters does not lead to a significant loss of light intensity since the light emitted by each pixel is not white but colored (which results from the technical effect of the optical cavities of different optical lengths). The advantage is better definition and better control of the colors generated by each group of pixels. In this respect, it should be noted that the light emitted by the pixels can include a weak component of the second (or even of the third) order; in particular, the blue light always includes a red light component, which corresponds to the peak of second order; this component of a greater order is advantageously absorbed by a filter that only lets the light of the first order pass.

In the example of FIG. 32, the colored filters 695a, 695b, 695c are placed on a transparent smoothing layer 690, which is an option; it can be made of polymer material.

It is very advantageous to provide an encapsulation system (not shown in the drawings) on the upper electrode 166, 266, 366, 466. It comprises at least one layer, and preferably several layers. It comprises a first layer of alumina, deposited by a conformal deposition technique which is preferably the technique called atomic layer deposition (ALD). It can comprise a second layer of polymer. It can comprise a third layer of alumina, also by ALD. This sequence of alternating layers of alumina and of polymer can be repeated one or more times, the last layer preferably being a layer of alumina or of titanium oxide. Such an encapsulation system protects the device against humidity and oxygen, which would risk degrading some of the layers, and in particular the layers that are part of the organic stack.

As indicated above, the optoelectronic device according to the invention can be made in the form of a light-emitting device of the OLED type; this can be a microdisplay. The better luminosity obtained according to the invention engenders a reduced electricity consumption and a longer service life. Such a high-luminance microdisplay can be used for example in glasses of the augmented-reality type or in devices of the HUD (Head-Up Display) type. It is advantageously made with at least three groups of pixels of a different color.

The optoelectronic device according to the invention can also be made as a multispectral optical sensor, containing organic photodiodes. Such a sensor transforms the incident light into an electric signal, which is generated by a photoactive stack of layers, which are preferably organic layers. In one embodiment (not shown in the drawings), this photoactive stack of layers comprises at least a first material, which is an electron donor, and a second material, which is an electron acceptor. According to the choice of the materials and the optical length of the cavities such a sensor can be made to respond in various ranges of the light spectrum, for example in the visible range and/or in the near-infrared range.

Such a sensor is useful in particular in the spectral range of the near infrared, which typically extends between approximately 780 nm and approximately 10 µm. To create such a sensor, said materials are characterized by the fact that the difference between the energy of the highest occupied level (HOMO—Highest Occupied Molecular Orbital) of said first material and the energy of the lowest unoccupied level (LUMO—Lowest Unoccupied Molecular Orbital) of said second material is less than approximately 1.6 eV.

Said first material can for example be a phthalocyanine (such as phthalocyanine of zinc or of iron) or an aromatic amine (such as N,N,N',N'-Tetrakis(4-methoxyphenyl)benzidine, abbreviated MeO-TPD, CAS no 122738-21-0) or a polythiophene (such as poly[2,5-bis(3-tetradecylthiophen-2-yl)thieno[3,2-b]thiophene], abbreviated PBTTT, CAS no 888491-19-8). These materials can be deposited under vacuum. Said second material can be a fullerene, such as $C_{60}$; these materials can also be deposited under vacuum.

Such an optoelectronic device can be made in the form of a spectrometer (by providing a plurality of groups of pixels, each group of which has an optical cavity of a different length), and/or in the form of a camera with a spatial and spectral resolution, by providing a plurality of pixels each consisting of a plurality of groups of pixels with an optical cavity of a different length.

LIST OF REFERENCE SYMBOLS

The following reference signs are used in the drawings and in the description:
10 Substrate (typically of the CMOS type)
11 Insulant (silicon nitride and/or oxide)
12 Lower electrode
13 First (lower) layer of titanium nitride (TiN)
14 Layer of aluminum
15 Second (upper) layer of titanium nitride (TiN)
16 First layer of TCO
17 First layer of photosensitive resin
18 Second layer of TCO
19 Second layer of photosensitive resin
20 Third layer of TCO
21 Third layer of photosensitive resin
22 Filling photosensitive resin (gap fill)
23 OLED stack
24 Semitransparent common electrode
25 Pixel
26 Pixel
27 Pixel
150 Substrate (typically of the CMOS type, including circuits for controlling the pixels, in the case of an OLED device, or for reading in the case of a sensor device
151 Insulant (typically silicon nitride and/or oxide)
152 Lower electrode
153 Metal layer of 152
154 Second (upper) layer of titanium nitride 152
155 First (lower) layer of titanium nitride 152
156 First layer of TCO ("soft" TCO)
157 Layers of TCO 156, 160 forming an optical spacer
158 Photosensitive resin (photoresist)
160 Second layer of TCO ("hard" TCO)
162 Photosensitive resin (photoresist)
164 Element for filling between pixels (gap-fill)
166 Upper electrode
167 Pixel
168 Group of pixels
170 OLED stack
171 First assembly of 170
175 Second assembly of 170
179 Third assembly of 170
257 Layers of TCO 156, 160 forming an optical spacer
266 Upper electrode
270 OLED stack
271 First assembly of layers of 270
272 Second assembly of layers of 270
273 Third assembly of layers of 270
276 First assembly of layers of 270
278 Second assembly of layers of 270
279 Third assembly of layers of 270
350 Substrate (typically of the CMOS type, including circuits for controlling the pixels, in the case of an OLED device, or for reading in the case of a sensor device
351 Insulant (typically silicon nitride and/or oxide)
352 Lower electrode
360 Second layer of TCO ("hard" TCO)
362 Photosensitive resin (photoresist)
364 Element for filling between pixels (gap-fill)
366 Upper electrode
367 Pixel
370 OLED stack
450 Substrate (typically of the CMOS type, including circuits for controlling the pixels, in the case of an OLED device, or for reading in the case of a sensor device
451 Insulant (typically silicon nitride and/or oxide)
452 Lower electrode
456 First layer of TCO ("soft" TCO)
460 Second layer of TCO ("hard" TCO)
466 Upper electrode
467 Pixel
470 OLED stack 550 Substrate (typically of the CMOS type, including circuits for controlling the pixels, in the case of an OLED device, or for reading in the case of a sensor device
551 Insulant (typically silicon nitride and/or oxide)
552 Lower electrode
560 Second layer of TCO ("hard" TCO)
567 Pixel
570 Tandem OLED stack
571 First assembly of layers of 570
572 Emitting layers of an OLED stack
574 Charge generation layer
575 Second assembly of layer 570
579 Third assembly of layers of 570
680 "Base" layer of TCO (hard)
690 Smoothing layer
695 Color filter
750 Substrate (typically of the CMOS type, including circuits for controlling the pixels, in the case of an OLED device, or for reading in the case of a sensor device
751 Insulant (typically silicon nitride and/or oxide)
752 Lower electrode
762 Photosensitive resin (photoresist)
764 Element for filling between pixels (gap-fill)
767 Pixel
1680 Group of pixels
1700 OLED stack
1751 Emitting layers of an OLED stack
1752 Emitting layers of an OLED stack
2701 $1^{st}$ assembly of a tandem OLED stack
2702 $2^{nd}$ assembly of a tandem OLED stack
3561 First layer of TCO (soft)
3562 First layer of TCO (soft)
3601 Second layer of TCO (hard)
3602 Second layer of TCO (hard)
3620 Photosensitive resin (photoresist)
4561 First layer of TCO (soft)
4562 First layer of TCO (soft)
4601 Second layer of TCO (hard)
4602 Second layer of TCO (hard)
5561 First layer of TCO (soft)
5562 First layer of TCO (soft)
5601 Second layer of TCO (hard)
5602 Second layer of TCO (hard)
5701 $1^{st}$ stack of layers of a tandem OLED stack 570
5702 $2^{nd}$ stack of layers of a tandem OLED stack 570
5710 Emitting layers of an OLED stack
5711 Emitting layers of an OLED stack
5712 Emitting layers of an OLED stack
5781 $1^{st}$ emissive layer of an OLED stack
5782 $2^{nd}$ emissive layer of an OLED stack
7561 First layer of TCO (soft)
7562 First layer of TCO (soft)
7601 Second layer of TCO (hard)
7602 Second layer of TCO (hard)
7620 Photosensitive resin (photoresist)

What is claimed is:

1. An optoelectronic device, comprising:
a substrate;
a stack of organic layers comprising:
at least one active layer to serve as a light-emitting layer or a photodiode, disposed between a reflective surface or a surface of a transparent layer deposited directly on said reflective surface, and
a semi-reflective surface disposed facing one another at a given distance and forming an optical cavity of a given optical length,
at least three groups of pixels, each group in the at least three groups of pixels having a cavity of a different optical length, the cavity comprising a plurality of bilayers arranged between the substrate and the stack of organic layers, each bilayer being formed by a first transparent conductive layer formed of a first transparent conductive material and a second transparent conductive layer formed of a second transparent conductive material in direct contact with the first transparent conductive layer, the first transparent conductive material being different than the second transparent conductive material,
wherein:
for a first group of pixels in the at least three groups of pixels, the number of bilayers is zero,
for a second group of pixels in the at least three groups of pixels, the number of bilayers is one,
for a third group of pixels in the at least three groups of pixels, the number of bilayers is one or two, when the number of bilayers is one the first layer of the bilayer associated therewith has a thickness that is greater than a thickness of the bilayer of the second group of pixels,
for each additional group of pixels in the at least three groups of pixels, if present, the number of bilayers increases by one with respect to a previous group or remains the same, when the number of bilayers remains the same, the first layer of the bilayer associated therewith has a thickness that is greater than a thickness of a preceding group of pixels,
the optical length of the cavity increases in numerical order of the at least three groups of pixels,
for each bilayer, the first conductive transparent layer, counted from the substrate, has a lower resistance to a wet etching treatment than the second conductive transparent layer, and
for each group of pixels beyond the first group of pixels, at least said first layer of the bilayer farthest from the substrate is protected laterally by the second layer of the bilayer.

2. The optoelectronic device of claim 1, wherein for each group of pixels beyond the first group of pixels, said first layer of the bilayer farthest from the substrate is totally encapsulated by the second transparent conductive layer.

3. The optoelectronic device of claim 1, wherein for each group of pixels beyond the first group of pixels, said first layer of all the bilayers is totally encapsulated by the second transparent conductive layer.

4. The optoelectronic device of claim 1, wherein the reflective surface is covered by a layer of the second transparent conductive material.

5. The optoelectronic device of claim 1, wherein in each of said bilayers, said first transparent conductive layer has a specific etching rate that is at least one thousand times greater than a specific etching rate of the second transparent conductive layer.

6. The optoelectronic device of claim 1, wherein the first transparent conductive material is selected from a group formed by:
ZnO, oxides containing ZnO that are doped with gallium, and/or aluminum, and/or boron, and/or beryllium,
indium oxide, and
oxide containing indium oxide and which are doped with tin.

7. The optoelectronic device of claim 6, wherein said second transparent conductive material is selected from a group formed by:
$SnO_2$, and
$SnO_2$ that is doped with arsenic and/or with fluorine, and/or nitrogen, and/or niobium, and/or phosphorus, and/or antimony, and/or aluminum, and/or titanium.

8. The optoelectronic device of claim 1, wherein said stack of organic layers is in direct contact with the reflective surface or the transparent layer, and/or,
the semi-reflective surface.

9. The optoelectronic device of claim 8, wherein said stack of organic layers is in direct contact with the semi-reflective surface.

10. The optoelectronic device of claim 1, wherein said stack of organic layers forms a continuous coating over all pixels in the at least three groups of pixels.

11. The optoelectronic device of claim 10, further comprising a semitransparent conductive layer deposited above said stack of organic layers which also forms a continuous coating over all pixels in the at least three groups of pixels.

12. The optoelectronic device of claim 1, wherein the substrate comprises a CMOS-type substrate having electrical circuits that facilitate an individual reading of the pixels in the at least three groups of pixels.

13. The optoelectronic device of claim 1, wherein the optoelectronic device comprises an OLED microdisplay.

14. The optoelectronic device of claim 1, wherein the optoelectronic device comprises a multispectral light sensor.

15. A method of manufacturing an optoelectronic device comprising:
depositing a first transparent conductive layer formed of a first transparent conductive material on a reflective surface;
depositing a first mask that defines and protects a location of a second group of pixels and a third group of pixels;
removing the first transparent conductive layer by wet etching at locations not protected by the first mask, the non-protected locations including a location for a first group of pixels,
removing the first mask after removing the first transparent conductive layer;
depositing a second transparent conductive layer formed of a second transparent material;
depositing a third transparent conductive layer formed of the first transparent conductive material;
depositing a second mask that defines and protects a location of the third group of pixels;
removing the third transparent conductive layer by wet etching at locations not protected by the second mask, the non-protected locations including a location for the first group of pixels and the second group of pixels;
removing the second mask after removing the third transparent conductive layer;
depositing a fourth transparent conductive layer formed of the second transparent conductive material;
depositing a third mask that defines and protects a location of the first group of pixels, the second group of pixels; and
removing the second transparent conductive layer, the fourth transparent conductive layer, the reflective layer and, the transparent layer by dry etching at the locations not protected by the third mask.

16. The method of claim 15, further comprising:
depositing a filling element in spaces between neighboring pixels;
depositing a stack of organic layers that is common to all the pixels;
depositing a semi-reflective electrode layer that is common to all the pixels above the stack of organic layers.

17. The method of claim 15, wherein depositing the second transparent conductive layer and the fourth transparent conductive layer is conducted by atomic layer deposition.

18. The method of claim 15, wherein the wet etching treatment comprises a treatment with an aqueous solution of tetramethylammonium hydroxide at 2.38% by weight at ambient temperature.

* * * * *